(12) United States Patent  
Carman

(10) Patent No.: US 10,796,742 B2
(45) Date of Patent: *Oct. 6, 2020

(54) CHARGE SHARING BETWEEN MEMORY CELL PLATES

(71) Applicant: Micron Technology, Inc., Boise, ID (US)

(72) Inventor: Eric S. Carman, San Francisco, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/513,036

(22) Filed: Jul. 16, 2019

(65) Prior Publication Data

US 2020/0005849 A1    Jan. 2, 2020

Related U.S. Application Data

(63) Continuation of application No. 16/188,855, filed on Nov. 13, 2018, now Pat. No. 10,395,714, which is a (Continued)

(51) Int. Cl.
*G11C 11/22* (2006.01)
*G11C 13/04* (2006.01)
(Continued)

(52) U.S. Cl.
CPC .............. *G11C 11/225* (2013.01); *G11C 8/08* (2013.01); *G11C 11/22* (2013.01); *G11C 11/221* (2013.01);
(Continued)

(58) Field of Classification Search
CPC ..... G11C 11/225; G11C 11/2253; G11C 8/08; G11C 11/22; G11C 11/221; G11C 13/047;
(Continued)

(56) References Cited

U.S. PATENT DOCUMENTS 5,959,878 A    9/1999 Kamp
6,028,784 A    2/2000 Mori et al.
(Continued)

FOREIGN PATENT DOCUMENTS

CN    1770317 A    5/2006
CN    1795509 A    6/2006
(Continued)

OTHER PUBLICATIONS

China National Intellectual Property Administration, "First Office Action," issued in connection with Chinese Patent Application No. 201780026023.1, dated Jul. 22, 2019 (11 pages).
(Continued)

*Primary Examiner* — Gene N Auduong
(74) *Attorney, Agent, or Firm* — Holland & Hart LLP

(57) ABSTRACT

Methods, systems, techniques, and devices for operating a ferroelectric memory cell or cells are described. A first ferroelectric memory cell may be used to charge a second ferroelectric memory cell by transferring charge from a plate of first ferroelectric memory cell to a plate of the second ferroelectric memory cell. In some examples, prior to the transfer of charge, the first ferroelectric memory cell may be selected for a first operation in which the first ferroelectric memory cell transitions from a charged state to a discharged state and the second ferroelectric memory cell may be selected for a second operation during which the second ferroelectric memory cell transitions from a discharged state to a charged state. The discharging of the first ferroelectric memory cell may be used to assist in charging the second ferroelectric memory cell.

20 Claims, 11 Drawing Sheets

Related U.S. Application Data continuation of application No. 15/659,994, filed on Jul. 26, 2017, now Pat. No. 10,127,963, which is a continuation of application No. 15/141,491, filed on Apr. 28, 2016, now Pat. No. 9,799,388.

(51) Int. Cl.
*G11C 8/08* (2006.01)
*G11C 11/56* (2006.01)

(52) U.S. Cl.
CPC ...... *G11C 11/2253* (2013.01); *G11C 11/2273* (2013.01); *G11C 11/2275* (2013.01); *G11C 11/2293* (2013.01); *G11C 13/047* (2013.01); *G11C 11/5657* (2013.01)

(58) Field of Classification Search
CPC ............ G11C 11/2275; G11C 11/2293; G11C 11/2273; G11C 11/5657
See application file for complete search history.

(56) References Cited

U.S. PATENT DOCUMENTS

| | | | |
|---|---|---|---|
| 6,147,895 A | 11/2000 | Kamp | |
| 6,256,220 B1 | 7/2001 | Kamp | |
| 6,538,914 B1 | 3/2003 | Chung | |
| 6,717,837 B2 | 4/2004 | Hasegawa et al. | |
| 6,856,573 B2 | 2/2005 | Allen et al. | |
| 7,079,410 B2 | 7/2006 | Kang | |
| 9,799,388 B1 | 10/2017 | Carman | |
| 9,830,990 B2 | 11/2017 | Izumi et al. | |
| 10,074,415 B2 | 9/2018 | Kawamura et al. | |
| 10,127,963 B2 | 11/2018 | Carman | |
| 2003/0185072 A1 | 10/2003 | Nishimura et al. | |
| 2006/0279977 A1 | 12/2006 | Shiga et al. | |
| 2016/0111138 A1 | 4/2016 | Izumi et al. | |

FOREIGN PATENT DOCUMENTS

| | | |
|---|---|---|
| JP | 2007149230 A | 6/2007 |
| JP | 2010055681 A | 3/2010 |
| JP | 2013502023 A | 1/2013 |
| JP | 2016081549 A | 5/2016 |

OTHER PUBLICATIONS

ISA/KR, International Search Report and Written Opinion of the International Searching Authority, Int'l. Appl. No. PCT/US2017/027952, dated Jul. 28, 2017, Korean Intellectual Property Office, Seo-gu, Daejeon, Republic of Korea, 14 pgs.

European Patent Office, "European Search Report," issued in connection with European Patent Application No. 17790115.4, dated Nov. 5, 2019 (9 pages).

Japanese Patent Office, "Notice of Rejection," issued in connection with Japanese Patent Application No. 2018-555916, dated Mar. 3, 2020 (4 pages).

CHARGE SHARING BETWEEN MEMORY CELL PLATES

CROSS REFERENCE

The present Application for Patent is a continuation of U.S. patent application Ser. No. 16/188,855 by Carman, entitled "Charge Sharing Between Memory Cell Plates," filed Nov. 13, 2018, which is a continuation of U.S. patent application Ser. No. 15/659,994 by Carman, entitled "Charge Sharing Between Memory Cell Plates," filed Jul. 26, 2017, which is a continuation of U.S. patent application Ser. No. 15/141,491 by Carman, entitled "Charge Sharing Between Memory Cell Plates," filed Apr. 28, 2016, assigned to the assignee hereof, and each of which is expressly incorporated by reference herein.

BACKGROUND

The following relates generally to memory devices and more specifically to charge sharing between plates associated with different memory cells.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may become discharged over time through leakage currents, resulting in the loss of the stored information. Certain aspects of volatile memory may offer performance advantages, such as faster read or write speeds, while aspects of non-volatile, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. Memory cells in FeRAM may be charged to certain voltages when performing access operations, such as read and write, among others. The time it takes to charge a memory cell may slow down memory operations and diminish one or more performance parameters. Also, the power consumed by charging a memory cell may decrease battery life and increase power and other operating requirements.

BRIEF DESCRIPTION OF THE DRAWINGS

The disclosure herein refers to and includes the following figures.

DETAILED DESCRIPTION

Figure 1:
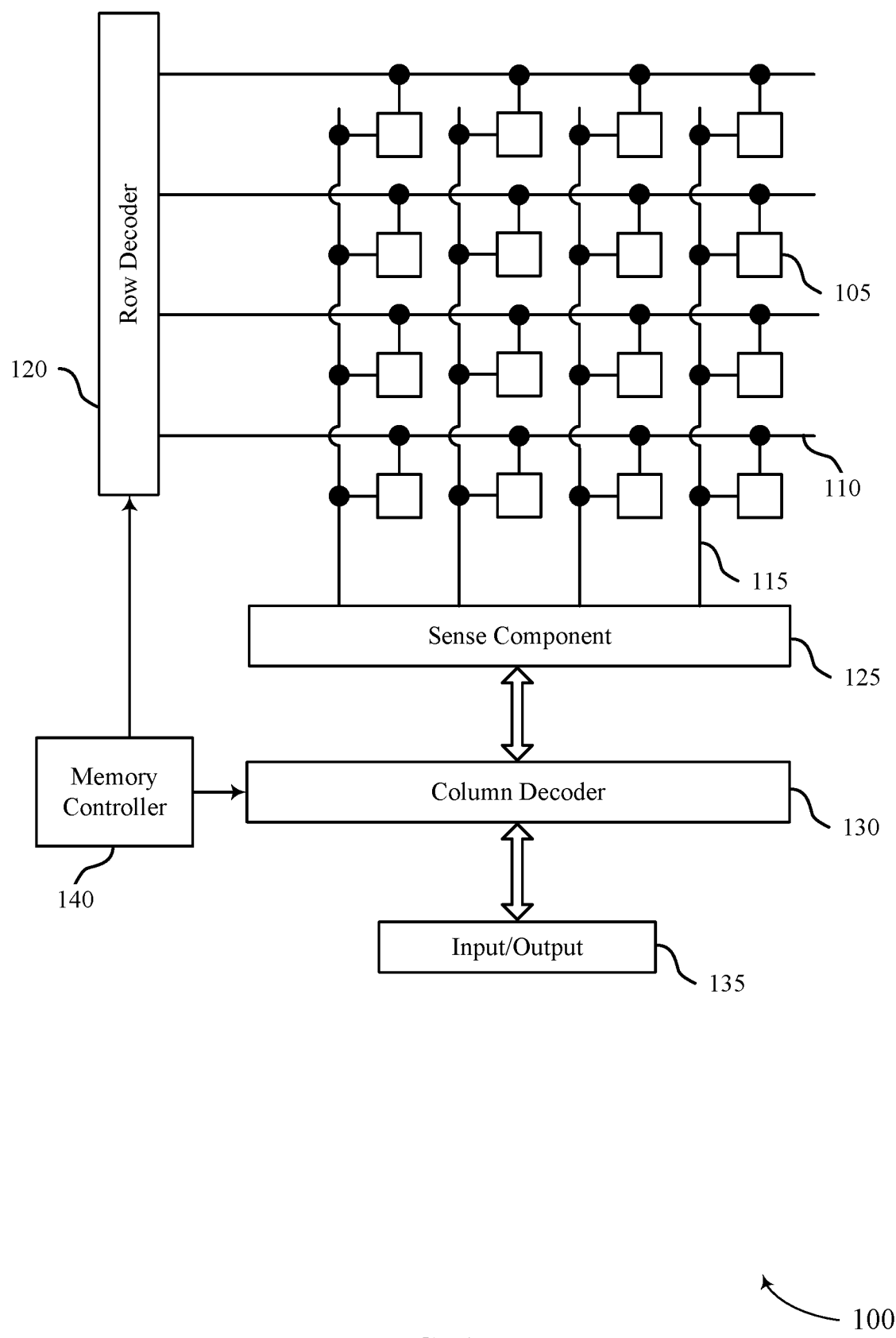
FIG. 1 illustrates an example memory array that supports charge sharing between memory cell plates in accordance with various embodiments of the present disclosure.

A memory cell charging scheme that reduces resource consumption (e.g., time or power consumption) may be implemented by charge sharing between memory cells. For example, charge on or relating to the plate of one memory cell may be used to charge the plate of another memory cell. This charge sharing may occur between cells that are transitioning to opposite charge states. For instance, a memory cell that is discharging (e.g., to prepare for a write operation, or at the end of a read operation) may be used to charge a memory cell to that is charging (e.g., to prepare for a read operation, or to prepare for a different write operation). This charge sharing may also occur between cells other than those transitioning to opposite charge states. Charge sharing may occur between plates when a conductive path is established between the plates (e.g., by activating one or more switching components in electronic communication with the plates).

As described in further detail below, memory cells, including ferroelectric memory cells, within a memory array may be accessed by a word line and a digit line. Access includes writing to a cell (e.g., storing a logic state) or reading a cell (e.g., sensing a stored logic state). Each cell may have a ferroelectric capacitor, or other storage component, that is used to store a logic value of the cell. For example, each cell may store either a logic 0 or a logic 1. Each stored logic value may correspond to a respective state of the cell and may produce a signal on a digit line of the cell. For example, a stored logic 1 may correspond to a first digit line voltage and a stored logic 0 may correspond to a second digit line voltage. The digit line may connect multiple memory cells and may be connected to a sense amplifier that, when activated during a read operation, is used to determine the stored logic state of a memory cell. For example, an activated sense amplifier may compare the signal (e.g., voltage) extracted from the cell to a reference signal.

A ferroelectric memory cell may be written or read by introducing voltage across a capacitor of the memory cell. For example, a logic 0 may be written to a memory cell by introducing a positive voltage across the capacitor, and a logic 1 may be written by introducing a negative voltage across the capacitor. The plate of a memory cell may be charged to a high voltage to perform a read operation, regardless of the logic state stored, and reduced to a low voltage at the end of the read operation. Thus, the operations of ferroelectric memory cells may involve repeated charging and discharging of the memory cells and in either case may involve applying a voltage to the cell.

In some memory arrays, a ferroelectric memory cell may be charged exclusively by using a power source (e.g., a voltage supply). As described herein, in other memory arrays a memory cell may be charged using the charge of a discharging memory cell alone or in addition to charge from a power source. The discharging memory cell may be connected to the charging memory cell so that charge is transferred from the plate of the discharging memory cell to the plate of the charging memory cell. The connection may be a conductive path that is established by activating one or more switching components (e.g., transistors) in electronic communication with the memory cells involved in the charge sharing.

In some cases, the discharging memory cell may be preparing to perform a write operation (e.g., a write logic 1) and the charging memory cell may be preparing to perform a read operation. In another example, the discharging memory cell may be finishing a read operation and the charging memory cell may be preparing to write a logic 0. In general, charge sharing between plates may occur using any combination of read/write operations, among other operations, in which the plates transition from a first charge state to a second charge state (e.g., from an initial charge to state to an opposite charge state). The plate charge sharing scheme and techniques described herein may be implemented by any number of memory cells. In some cases, the plate charge sharing scheme is used to charge or discharge memory cells in two different sections of a memory array. In other cases, the plate charge sharing scheme is used to charge or discharge memory cells in one section of a memory array.

As described herein, using charge from a first memory cell plate to charge a second memory cell plate may reduce the amount of power drawn from a voltage supply to charge (e.g., partially charge, fully charge) the second memory cell. For example, the second plate may be partially charged by the first plate prior to activating the voltage supply, which reduces the power consumed from the voltage supply to finish charging the second memory cell. In some cases, plate-charge sharing may reduce the charging time of the second memory cell. For instance, the second memory cell may be charged using the first plate and the voltage supply simultaneously or in an overlapping manner. Using charge from two sources at the same time may reduce the time it takes to fully charge the second memory cell.

Embodiments of the disclosure introduced above are further described below in the context of a memory array. Specific examples are then described for charge sharing between memory cell plates. These and other embodiments of the disclosure are further illustrated by and described with reference to apparatus diagrams, system diagrams, and flowcharts that relate to plate charge sharing.

FIG. 1 illustrates an example memory array 100 that supports charge sharing between memory cell plates in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, a memory cell 105 is configured to store more than two logic states. A memory cell 105 may include a capacitor to store a charge representative of the programmable states; for example, a charged and an uncharged capacitor may represent two logic states. DRAM architectures may commonly use such a design, and the capacitor employed may include a dielectric material with linear electric polarization properties. By contrast, a ferroelectric memory cell may include a capacitor that has a ferroelectric as the dielectric material. Different levels of charge of a ferroelectric capacitor may represent different logic states. Ferroelectric materials have non-linear polarization properties, and some details and advantages of a ferroelectric memory cell 105 are discussed below.

Operations such as reading and writing may be performed on memory cells 105 by activating or selecting the appropriate word line 110 and digit line 115. A word line 110 may also be referred to as an access line. Activating or selecting a word line 110 or a digit line 115 may include applying a voltage (e.g., a positive voltage, a negative voltage) to the respective line. In some cases, a digit line 115 may be referred to as a bit line. Word lines 110 and digit lines 115 may be made of conductive materials. In some examples, word lines 110 and digit lines 115 are made of metals (e.g., copper, aluminum, gold, tungsten, etc.). According to the example of FIG. 1, each row of memory cells 105 are connected to a single word line 110, and each column of memory cells 105 are connected to a single digit line 115. By activating one word line 110 and one digit line 115, a single memory cell 105 may be accessed at their intersection. The intersection of a word line 110 and digit line 115 may be referred to as an address of a memory cell.

In some architectures, the logic storing device of a cell, e.g., a capacitor, may be electrically isolated from the digit line by a selection device. The word line 110 may be connected to and may control the selection device. For example, the selection device may be a transistor and the word line 110 may be connected to the gate of the transistor. Activating the word line 110 results in an electrical connection between the capacitor of a memory cell 105 and its corresponding digit line 115. The digit line may then be accessed to either read or write the memory cell 105.

Accessing memory cells 105 may be controlled through a row decoder 120 and a column decoder 130. For example, a row decoder 120 may receive a row address from the memory controller 140 and activate the appropriate word line 110 based at least in part on the received row address. Similarly, a column decoder 130 receives a column address from the memory controller 140 and activates the appropriate digit line 115. Thus, by activating a word line 110 and a digit line 115, a memory cell 105 may be accessed.

Upon accessing, a memory cell 105 may be read, or sensed, by sense component 125. For example, sense component 125 may compare a signal (e.g., a voltage) of the relevant digit line 115 to a reference signal (not shown) in order to determine the stored state of the memory cell 105. If digit line 115 has a higher voltage than the reference voltage, then sense component 125 may determine that the stored state in memory cell 105 was a logic 1 and vice versa. Sense component 125 may include various transistors and amplifiers in order to detect or amplify a difference in the signals, which may be referred to as latching. The detected logic state of memory cell 105 may then be output through column decoder 130 as output 135. To read a memory cell 105, a plate of the memory cell 105 may be charged to a certain voltage. The voltage may be, at least in part, the result of a charge transferred to the plate from a plate of another memory cell 105.

A memory cell 105 may be set, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. In the case of a ferroelectric capacitor, a memory cell 105 is written by applying a voltage across the ferroelectric capacitor. Applying a voltage across the capacitor may involve charging or discharging a plate of the capacitor to a certain voltage. In some cases, the plate of a capacitor may discharge by transferring charge to another capacitor plate (e.g., the capacitor of a charging memory cell 105). Thus, a discharging capacitor plate may be used to charge another capacitor plate. This process is discussed in more detail throughout the present disclosure.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high—e.g., tens of refresh operations per second may be employed for DRAM—which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery.

Ferroelectric memory cells may, however, have beneficial properties that may result in improved performance relative to other memory architectures. For example, because ferroelectric memory cells tend to be less susceptible to degradation of stored charge, a memory array 100 that employs ferroelectric memory cells 105 may require fewer or no refresh operations, and may thus require less power to operate. Additionally, as described herein, ferroelectric memory cells may implement charge sharing between plates, which may reduce resource consumption. For example, the charge sharing scheme may reduce the time and the power needed to charge a memory cell for an access operation (e.g., a read operation or a write operation) or one or more other operations.

The memory controller 140 may control the operation (e.g., read, write, re-write, refresh, etc.) of memory cells 105 through the various components, for example, row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. For example, the memory controller 140 may facilitate the application of biasing voltages to one or more various components so that charge sharing between cell plates occurs. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2A:
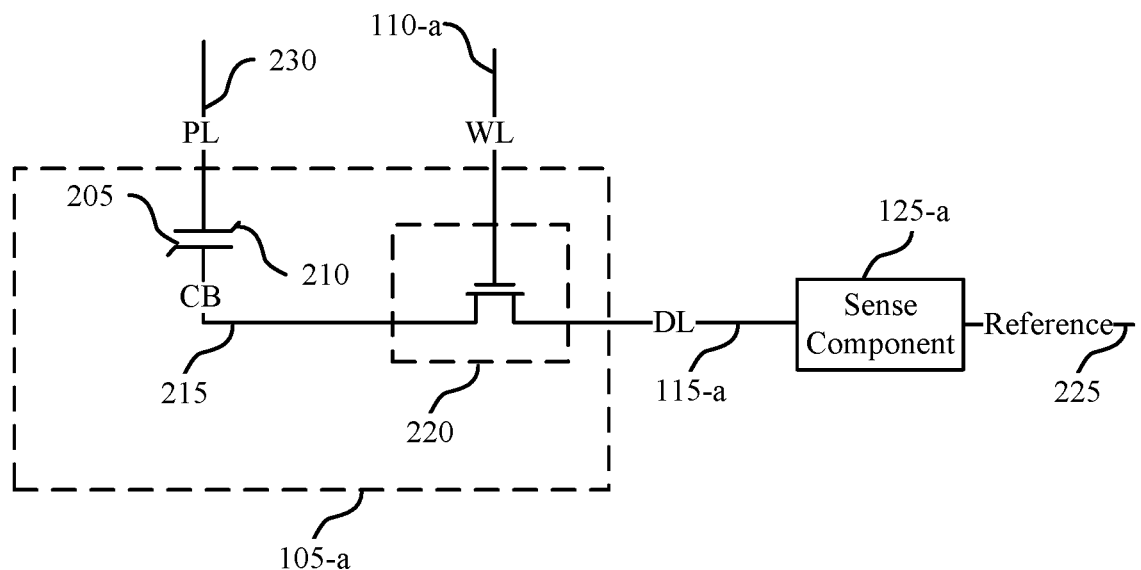
FIG. 2A illustrates an example circuit of a memory cell that supports charge sharing between memory cell plates in accordance with various embodiments of the present disclosure.

FIG. 2A illustrates an example circuit 200-*a* that supports charge sharing between memory cell plates in accordance with various embodiments of the present disclosure. Circuit 200-*a* includes a ferroelectric memory cell 105-*a*, word line (WL) (or access line) 110-*a*, digit line 115-*a*, and sense component 125-*a*, which may each be examples of a memory cell 105, word line 110, digit line 115, or sense component 125, respectively, as described with reference to FIG. 1, among others. Memory cell 105-*a* may include a logic storage component, such as capacitor 205, which has a first plate and a second plate that are capacitively coupled or in communication. The first plate may be referred to as cell plate 210 and the second plate may be referred to as cell bottom (CB) 215. A cell plate 210 may also be referred to as a plate 210. Cell plate 210 may be accessed via plate line (PL) 230 and cell bottom 215 may be accessed via digit line (DL) 115-*a*. In the example of FIG. 2, the terminals of capacitor 205 may be separated by an insulating ferroelectric material. As described above, various states may be stored by charging or discharging capacitor 205, i.e., polarizing the ferroelectric material of capacitor 205.

As described above, various states may be stored (and read) by charging or discharging capacitor 205, i.e., polarizing the ferroelectric material of capacitor 205. The total charge need to polarize capacitor 205 may be referred to as the remnant polarization (PR) value, and a voltage of capacitor 205 at which half the total charge of capacitor 205 is reached may be referred to as the coercive voltage (VC). In some cases, (e.g., when capacitor 205 is preparing for a read or other operation) capacitor 205 may be charged using charge from another capacitor 205 or charge from a voltage supply. In other cases, (e.g., when capacitor 205 is preparing for a write operation or other operation) capacitor 205 may be discharged by transferring charge to another capacitor 205.

The stored state of capacitor 205 may be read or sensed by operating various elements represented in circuit 200-*a*. Capacitor 205 may be in electronic communication with digit line 115-*a*. Capacitor 205 may thus be isolated from the digit line 115-*a* when selection component 220 is deactivated, and capacitor 205 may be connected to digit line 115-*a* via selection component 220 when selection component 220 is activated to select the ferroelectric memory cell 105-*a*. In other words, ferroelectric memory cell 105-*a* may be selected using selection component 220 that is in electronic communication with ferroelectric capacitor 205, where ferroelectric memory cell 105-*a* includes selection component 220 and ferroelectric capacitor 205. In some cases, selection component 220 may be a transistor and its operation may be controlled by applying a voltage to the transistor gate, where the voltage magnitude is such that the threshold voltage magnitude of the transistor is exceeded.

Word line 110-*a* may activate selection component 220; for example, a voltage applied to word line 110-*a* may be applied to the transistor gate, connecting capacitor 205 with digit line 115-*a*. In an alternative embodiment, the positions of selection component 220 and capacitor 205 (among other components) may be switched so that selection component 220 is between plate line 230 and cell plate 210 and so that capacitor 205 is between digit line 115-*a* and the other terminal of selection component 220, among other various configurations and positions. In this embodiment, selection component 220 may remain in electronic communication with digit line 115-*a* through capacitor 205. This configuration may be associated with alternative timing.

In the example depicted in FIG. 2A, capacitor 205 is a ferroelectric capacitor. Due to the ferroelectric material between the plates of capacitor 205, and as discussed in more detail below, capacitor 205 may not discharge upon connection to digit line 115-*a*. In one embodiment, to sense the state that is stored by ferroelectric capacitor 205 during a read operation, plate 210 or word line 110-*a* may be biased by an external voltage. Selecting ferroelectric memory cell 105-*a* may result in a voltage difference (e.g., plate 210 voltage minus digit line 115-*a* voltage) across capacitor 205. The applied voltage difference may yield a change in the stored charge on capacitor 205, which may depend on the initial state of capacitor 205—e.g., whether the initial state stored a logic "1" or a logic "0"—and may induce a voltage on digit line 115-*a* based on the resulting charge stored on capacitor 205. The induced voltage on digit line 115-*a* may then be compared to a reference (e.g., a voltage of reference line 225) by sense component 125-*a* in order to determine the stored logic state in memory cell 105-*a*.

To bias capacitor 205, a voltage from a power or voltage supply may be applied to plate 210 (e.g., by activating a switching component between plate 210 and the voltage supply. among other contemplated methods). In some cases, the resulting charge on plate 210 may be used to charge the plate of another memory cell. In other cases, the charge from the voltage supply may be supplemented by charge transferred from the plate of another capacitor. For example, a conductive path may be created between plate 210 and the plate of the other memory cell (among other components) so that charge is transferred between the plates. In some embodiments, the conductive path may be dynamically established by activating one or more switching components that are in electronic communication with the plates 210. As described herein, charge sharing between plates 210 may reduce the time and/or power it takes to charge a plate 210.

The specific sensing technique or process may take many forms. In one example, digit line 115-*a* may have an intrinsic capacitance and develop a non-zero voltage as capacitor 205 charges or discharges in response to the voltage applied to plate 210. The intrinsic capacitance may depend on physical characteristics, among other characteristics, including the dimensions of digit line 115-*a*. In some embodiments, digit line 115-*a* may connect multiple memory cells 105 so digit line 115-*a* may have a length that results in a non-negligible capacitance (e.g., on the order of pF). The subsequent voltage of digit line 115-*a* may depend on the initial logic state of capacitor 205, and sense component 125-*a* may compare this voltage to a voltage on reference line 225 provided by a reference component. For example, a voltage may be applied to plate 210 and a voltage at capacitor bottom 215 may change in relation to the stored charge. The voltage at capacitor bottom 215 may be compared with a reference voltage at sense component 125-*a*, and a comparison to the reference voltage may indicate a change in the charge of capacitor 205 resulting from the applied voltage and thus indicate a logic state stored in memory cell 105-*a*. The relationship between charge and voltage in capacitor 205 is described in further detail with reference to FIG. 3.

To write memory cell 105-*a*, a voltage may be applied across capacitor 205. Various methods may be used. In one example, selection component 220 may be activated through word line 110-*a* in order to electrically connect capacitor 205 to digit line 115-*a*. A voltage may be applied across capacitor 205 by controlling the voltage of plate 210 using plate line 230 or controlling the voltage of cell bottom 215 using digit line 115-*a*, among other methods. To write a logic 0, plate 210 may be taken high, that is, a positive voltage may be applied, and cell bottom 215 may be taken low, i.e., connected to ground, virtually grounded, or a negative voltage may be applied to plate 210. The opposite process is performed to write a logic 1, i.e., the voltage of plate 210 may be taken low and the voltage of cell bottom 215 may be taken high. As described herein, some or all of the charge used to apply a voltage to plate 210 may be transferred to or from the plate of another cell.

Figure 2B:
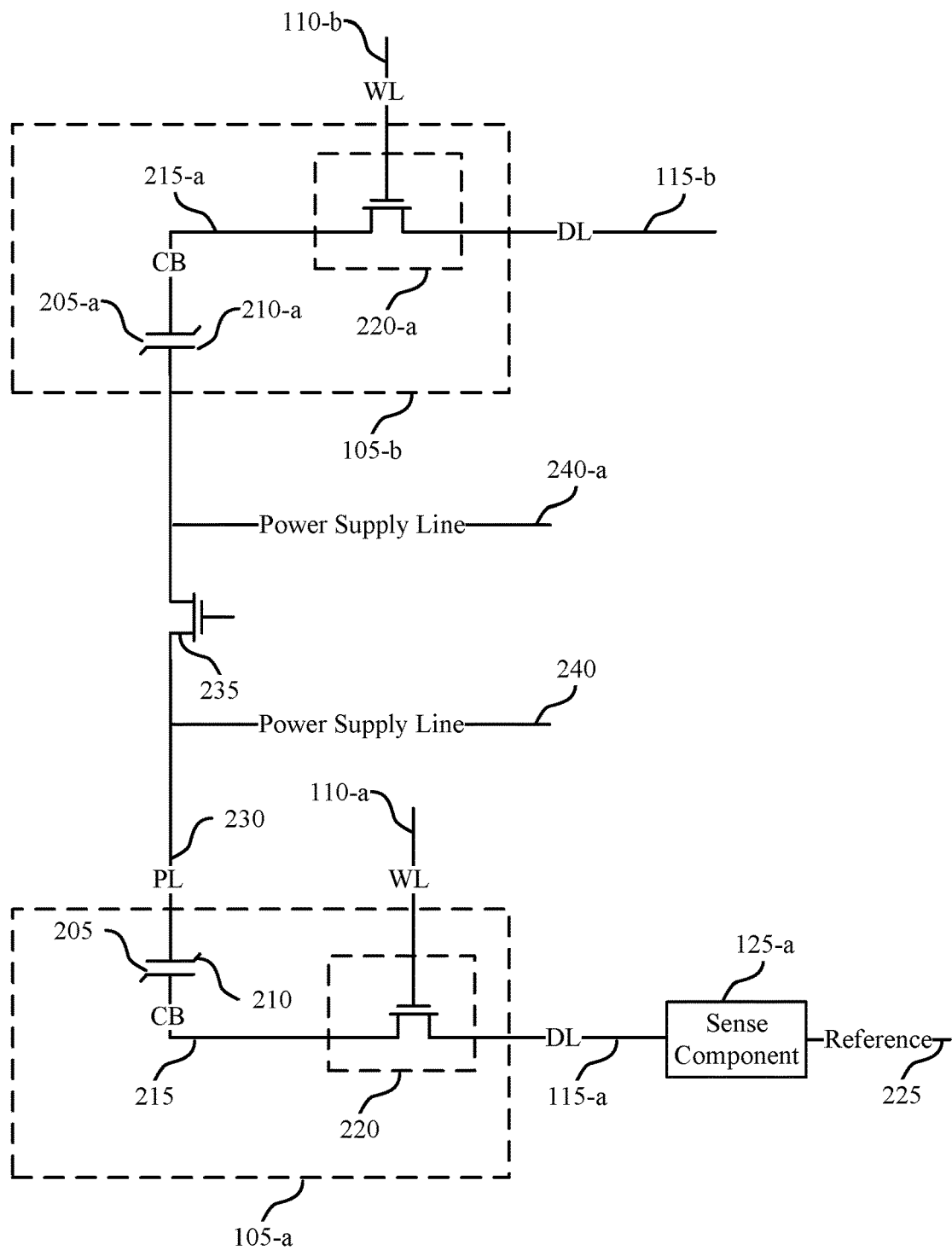
FIG. 2B illustrates an example circuit of a memory cell that supports charge sharing between memory cell plates in accordance with various embodiments of the present disclosure.

FIG. 2B illustrates an example circuit 200-*b* that supports charge sharing between memory cell plates in accordance with various embodiments of the present disclosure. Circuit 200-*b* may be an example of circuit 200-*a* as described with reference to FIG. 2A, among others, and may facilitate charge sharing between cell plates 210. Circuit 200-*b* may include a second memory cell 105-*b*. Memory cell 105-*b* may include selection component 220-*a* and capacitor 205-*a*. Selection component 220-*a* may be activated through word line 110-*b*. When word line 110-*b* is activated, the voltage on digit line 115-*b* may be the voltage on cell bottom 215-*a*. In some cases, memory cell 105-*a* and memory cell 105-*b* may be included in a set of cells accessed by the same word line 110. In other cases, memory cell 105-*a* and memory cell 105-*b* may be accessed by two different word lines (e.g., word line 110-*a* and word line 110-*b*, respectively).

Circuit 200-*b* may also include a power supply line 240 that is used to apply biasing voltages to plate 210 or power supply line 240-*a* that is used to apply voltages to plate 210-*a*. Each power supply line 240 may be capable of applying biasing voltages of different values (e.g., 1.6V and 1.8 V). The power supply lines 240 may be configured so that voltage can be applied independently to their respective plates 210. Plate 210 and plate 210-*a* may be connected (e.g., shorted) by activating switching component 235, among other techniques. That is, activation of switching component 235 may provide a conductive path between plate 210 and plate 210-*a* that facilitates charge flowing from one plate 210 to another.

Power supply line 240 may apply voltages to plate 210 so that read and write operations may occur. Thus, plate 210 may be charged at various times during operation of circuit 200-*a*. In some cases, at least part of the charge on plate 210 may be used to at least partially charge plate 210-*a*. For example, switching component 235 may be activated so that charge sharing occurs between the plate 210 and plate 210-*a*. That is, charge may transfer from plate 210 to plate 210-*a* via the conductive path established by activating switching component 235 or one or more other alternative paths. Switching component 235 may be activated prior to memory cell 105-*a* or memory cell 105-*b* transitioning from each respective charge states. For example, memory cell 105-*a* may be selected (e.g., via activation of selection component 220) for an operation that calls for memory cell 105-*a* to change from a first state (e.g., a charged state) to a second state (e.g., a discharged state). For example, memory cell 105-*a* may be at the end of a read operation, or preparing for a write logic 1 operation. And memory cell 105-*b* may be selected (e.g., via activation of selection component 220-*a*) for an operation that calls for memory cell 105-*b* to change from a discharged state to a charged state (e.g., memory cell 105-*b* may be preparing for a read operation, or to write a logic 0).

Thus, plate 210 or plate 210-*a*, or both, may each be transitioning from a charge state to a new charge state that is opposite (e.g., plate 210 may be transitioning from a charged state to a discharged state and plate 210-*a* may be transitioning from a discharged state to a charged state). In some embodiments, plate 210 and plate 210-*a* may switch charge states with each other. In the example depicted in FIG. 2A, the charge transferred from plate 210-*a* may be supplemented by charge from another source (e.g., power supply line 240-*a*) to fully charge plate 210-*a* to a predetermined threshold charge amount for a subsequent operation. In one example, charge from plate 210 and charge from power supply line 240-*a* may be simultaneously transferred to plate 210-*a*, which may reduce the time needed to fully charge plate 210-*a*. In another example, charge from plate 210 and charge from power supply line 240-*a* may be transferred during an overlapping period to plate 210-*a*, which may also reduce the time needed to fully charge plate 210-*a*. In another example, charge from power supply line 240-*a* may be transferred to plate 210-*a* after plate 210-*a* has been partially charged using charge from plate 210. This implementation may reduce the power needed to fully charge plate 210-*a*.

Figure 3:
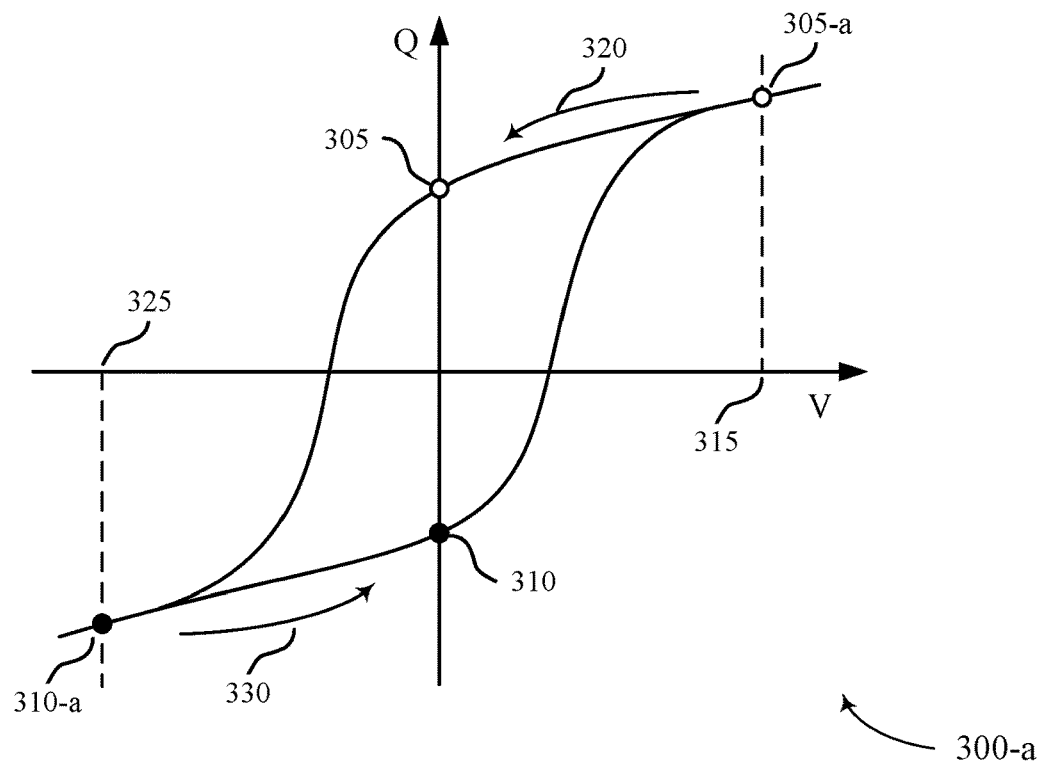
FIG. 3 illustrates example hysteresis plots for operating a ferroelectric memory cell that supports charge sharing between memory cell plates in accordance with various embodiments of the present disclosure.
Figure 3:
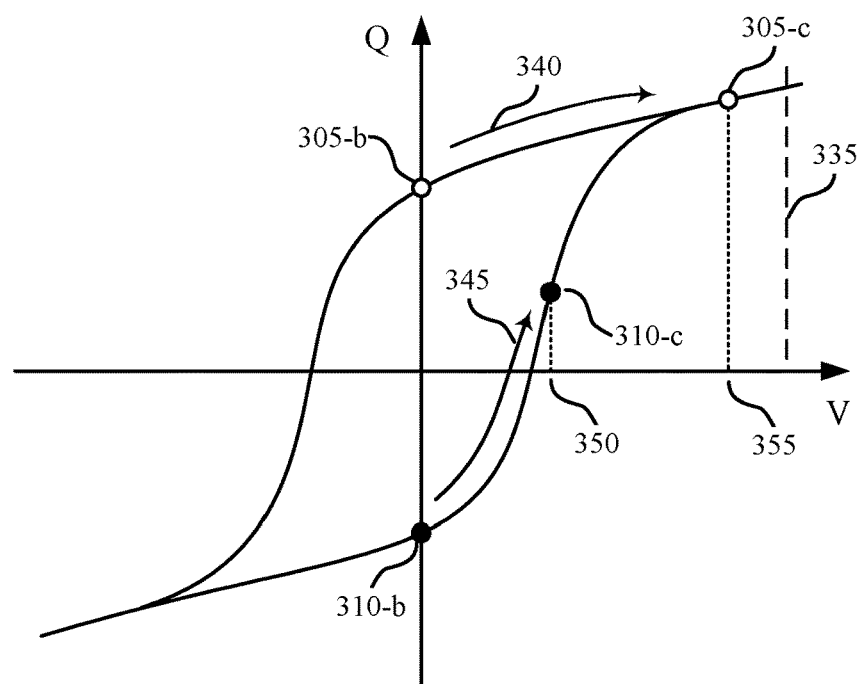

Read and write operations of capacitor 205 may account for the non-linear properties associated with a ferroelectric device. FIG. 3 illustrates examples of such non-linear properties with hysteresis curves 300 for a ferroelectric memory cell that supports charge sharing between memory cell plates in accordance with various embodiments of the present disclosure. Hysteresis curves 300-*a* and 300-*b* illustrate an example ferroelectric memory cell writing and reading process, respectively. Hysteresis curves 300 depict the charge, Q, stored on a ferroelectric capacitor (e.g., capacitors 205 of FIG. 2A) as a function of a voltage, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge will accumulate at the terminal. Likewise, if the ferroelectric material has a positive polarization, negative charge will accumulate at the terminal. Additionally, it should be understood that the voltages in hysteresis curves 300 represent a voltage difference across the capacitor and are directional. For example, a positive voltage may be applied by applying a positive voltage to the terminal in question and maintaining the second terminal at ground. A negative voltage may be applied by maintaining the terminal in question at ground and applying a positive voltage to the second terminal, i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300. As described herein, a voltage may be applied to a second capacitor by transferring charge from a first capacitor. This charge may supplement charge supplied to the second capacitor by a voltage supply (e.g., charge from a voltage supply that is transferred via a power supply line).

As depicted in hysteresis curve 300-*a*, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-*a* is reached. Upon removing positive voltage 315, charge state 305-*a* follows path 320 until it reaches charge state 305 at zero voltage potential. Similarly, charge state 310 is written by applying a net negative voltage 325, which results in charge state 310-*a*. After removing negative voltage 325, charge state 310-*a* follows path 330 until it reaches charge state 310 at zero voltage.

To read, or sense, the stored state of the ferroelectric capacitor, a voltage may be applied across the capacitor (e.g., by transferring charge from another capacitor's plate). In response, the stored charge changes, and the degree of the change depends on the initial charge state—i.e., the degree to which the stored charge of the capacitor changes varies depending on whether charge state 305-*b* or 310-*b* was initially stored. For example, hysteresis curve 300-*b* illustrates two possible stored charge states 305-*b* and 310-*b*. Net voltage 335 may be applied to the plate (e.g., plate 210 with reference to FIG. 2) of the capacitor. Although depicted as a positive voltage, voltage 335 may be negative. In response to voltage 335, charge state 305-*b* may follow path 340.

Likewise, if charge state 310-*b* was initially stored, then it follows path 345. The final position of charge state 305-*c* and charge state 310-*c* depend on a number of factors, including the specific sensing operation and circuitry.

In some cases, the final charge may depend on the intrinsic capacitance of the digit line of a memory cell. For example, if the capacitor is electrically connected to the digit line and voltage 335 is applied, the voltage of the digit line may rise due to its intrinsic capacitance and the voltage measured at a sense component may depend on the resulting voltage of the digit line. The position of final charge states 305-*c* and 310-*c* on hysteresis curve 300-*b* may thus depend on the capacitance of the digit line and may be determined through a load-line analysis, i.e., charge states 305-*c* and 310-*c* may be defined with respect to the digit line capacitance. As a result, the voltage of the capacitor, voltage 350 or voltage 355, may be different and may depend on the initial state of the capacitor.

By comparing the difference of the voltage applied to the cell plate (e.g., voltage 335) and the voltage across the capacitor (e.g., voltage 350 or voltage 355) to a reference voltage (among other values), the initial state of the capacitor may be determined. As can be understood by reference to FIG. 2A, the voltage of the digit line may be represented as the difference of the voltage applied to plate 210 and the resulting voltage across the capacitor 205. As discussed above, the voltage of the digit line may be based on the change in charge stored at the capacitor, and the change in charge may be associated with the magnitude of the voltage that is applied across the capacitor. In some examples, the reference voltage may be an average of the digit line voltages that result from voltage 350 and 355 and, upon comparison, the sensed digit line voltage may be determined to be higher or lower than the reference voltage. A value of the ferroelectric cell (i.e., a logic "0" or "1") may then be determined based on the comparison.

As discussed above, reading a memory cell that does not use a ferroelectric capacitor may degrade or destroy the stored logic state. A ferroelectric memory cell, however, may maintain the initial logic state after a read operation. For example, if charge state 305-*b* is stored and the read operation performed, the charge state may follow path 340 to charge state 305-*c*, and after removing voltage 335, the charge state may return to initial charge state 305-*b*, for example, by following path 340 in the opposite direction.

Figure 4:
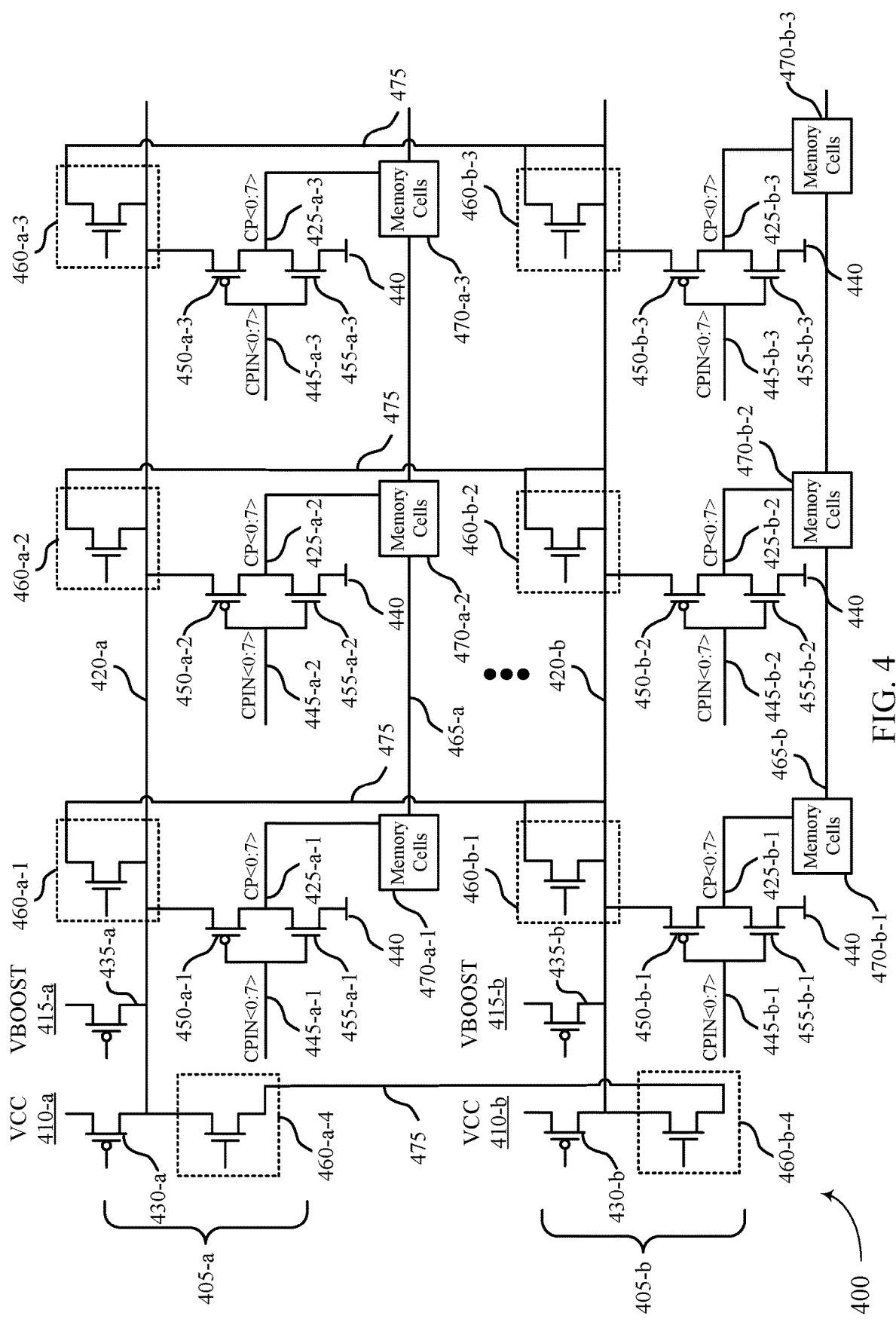
FIG. 4 illustrates an example circuit that supports charge sharing between memory cell plates in accordance with various embodiments of the present disclosure.

FIG. 4 illustrates an example circuit 400 that supports charge sharing between memory cell plates in accordance with various embodiments of the present disclosure. Circuit 400 may include Nsections, including section 405-*a* and section 405-*b*, among others. Each section 405 may be powered by two or more independently controlled voltage supplies, VCC 410 and VBOOST 415. For example, section 405-*a* may be powered by VCC 410-*a* and VBOOST 415-*a* and section 405-*b* may be powered by VCC 410-*b* and VBOOST 415-*b*. Each VCC 410 may supply a first voltage (e.g., 1.6V) to a corresponding power supply line 420 and each VBOOST 415 may supply a second voltage (e.g., 1.8V) to a corresponding power supply line 420. In some embodiments, VCC 410-*a* and VBOOST 415-*a* may be used to apply voltage to power supply line 420-*a* and VCC 410-*b* and VBOOST 415-*b* may be used to apply voltage to power supply line 420-*b*. In some embodiments, VBOOST 415 may supply a greater voltage rating than VCC 410. In some embodiments, VBOOST 415 may supply a lesser voltage rating than VCC 410. Power supply lines 420 may be examples of a power supply line 240 described with reference to FIG. 2B, among others. The sections 405 of circuit 400 may be independently accessed; for example, section 405-*a* may be operated at the same or different time as section 405-*b*.

Each section 405 may include a number of plate lines 425, with each plate line corresponding to a subarray of memory cells 470, which cells may be examples of a memory cell 105 described with reference to FIGS. 1-3, among others. A plate line 425 may be an example of a plate line 230 and may be used to apply voltages to multiple plates (e.g., the plates of a set of memory cells). A subarray of memory cells may include 8 sets of cell plates (CP 0 through CP 7, or CP 0:7). A set of cell plates may include the cell plates of multiple memory cells. The memory cells of a set of cell plates (e.g., of a single plate line 425) may include multiple rows of memory cells. Each row of memory cells included in a plate line 425 may be accessed by one or more respective word lines 465-*a*. A word line used to access a row of memory cells may be isolated from other word lines based on a relative spacing or other isolation technique. For ease of illustration, a single plate line 425 and word line 465 is shown; however, any number of plate lines and word lines may be used with the techniques described herein. The memory cells 470 of a section 405 may be accessed using word lines 465 specific to that section 405. For example, the memory cells 470-*a* in section 405-*a* may be accessed using one or more word lines 465-*a* and the memory cells 470-*b* in section 405-*b* may be accessed using one or more word lines 465-*b*.

The plate lines 425 of two different sections may be in electronic communication with each other via one or more switching components 460 or via one or more equalization lines 475. The plate lines 425 of different sections may be referred to as a first plate line and a second plate line. An equalization line may provide a conductive path between different power supply lines 420, and, consequently, between plates of memory cells in different sections 405. The equalization lines 475 may serve as part of a conductive path between cell plates when switching components 460 are activated. Each plate line 425 (and corresponding memory cells 470) in a section 405 may be powered by the same power supply line 420. A power supply line 420 may be powered by activating switching components 430 and switching components 435. For instance, power supply line 420-*a* may be powered by VCC 410-*a* (e.g., by activating switching component 430-*a*), or powered by VBOOST 415-*a* (e.g., by activating switching component 435-*a*). Each voltage supply (VCC 410) and (VBOOST 415) may be in electronic communication with the plate lines 425 of each section 405.

The cell plates of memory cells 470 may be connected to a power supply line 420 or ground 440 by applying a voltage to driver CPIN 445. For example, reducing the voltage applied to a driver CPIN 445 (e.g., CPIN 0) may activate a corresponding switching component 450 or deactivate a corresponding switching component 455 (or some combination), which may allow charge to flow between power supply line 420 and the corresponding set of plates (e.g., CP 0) of memory cells 470, among other components. Applying a positive voltage to driver CPIN 445 (e.g., CPIN 0) may activate a corresponding switching component 455 or deactivate a corresponding switching component 450 (or some combination), which may connect the corresponding set of cell plates (e.g., CP 0) of memory cells 470 to ground 440.

Each section 405 may have a corresponding set of switching components 460 that, when activated, establish a conductive path between sections 405 (e.g., between the power supply lines 420). For instance, activating switching components 460-*a* and switching components 460-*b* may establish a conductive path between plate line 425-*a* and plate line 425-*b* (e.g., if switching components 450-*a* and switching components 450-*b* are activated). Thus, the charge on cell plates in a first section 405 may flow from and be used to charge cell plates in different section. For example, charge from cell plates of memory cells 470-*a* may be used to charge cell plates of memory cells 470-*b*. Charge sharing between cell plates may occur at different levels of granularity, including charge sharing between two or more individual cells, between one or more sets of cells, between subarrays of cells, and/or between sections of cells. As described herein, charge transfer between cell plates may occur between cell plates that are powered by different or the same power supply lines 420. In some cases charge-transfer between cell plates may occur between cells that are powered by a single power supply line 420.

Switching components 460 may be examples of a switching component 235 described with reference to FIG. 2A, among others. Although the switching components in FIG. 4 are shown as a particular type (e.g., p-type or n-type), the techniques described herein may be implemented using one or more different types of switching components. For example, at least some or all of the p-type switching components in FIG. 4 (e.g., switching components 430, 435, and 450) may be modified to be n-type and at least some or all of the n-type switching components (e.g., switching components 460 and 455) may be modified to be p-type. Alterations in switching component type may be associated with alternative activation voltages and timing. For example, components may be activated using voltages with an opposite polarity than described herein.

Charge sharing between sections 405 may occur when two different sections 405 are initialized to opposite states and then selected for an operation that calls for a transition in charge state for each section 405. For example, cell plates of memory cells 470-*a* may be selected (e.g., via word lines 465-*a*) to transition from a charged state to a discharged state and cell plates of memory cells 470-*b* may selected (e.g., via word lines 465-*b*) to transition from a discharged state to a charged state. A memory cell may transition from a discharged state to a charged state to perform one or more read operations or to perform one or more write logic 1 operations. In some embodiments, a memory cell may transition from a charged state to a discharged state at the end of a read operation or to perform a write logic 0 operation. Thus, a change in the charge state of a memory cell may be initiated by preparing to perform read and write operations or performing read and write operations, among others.

Figure 5:
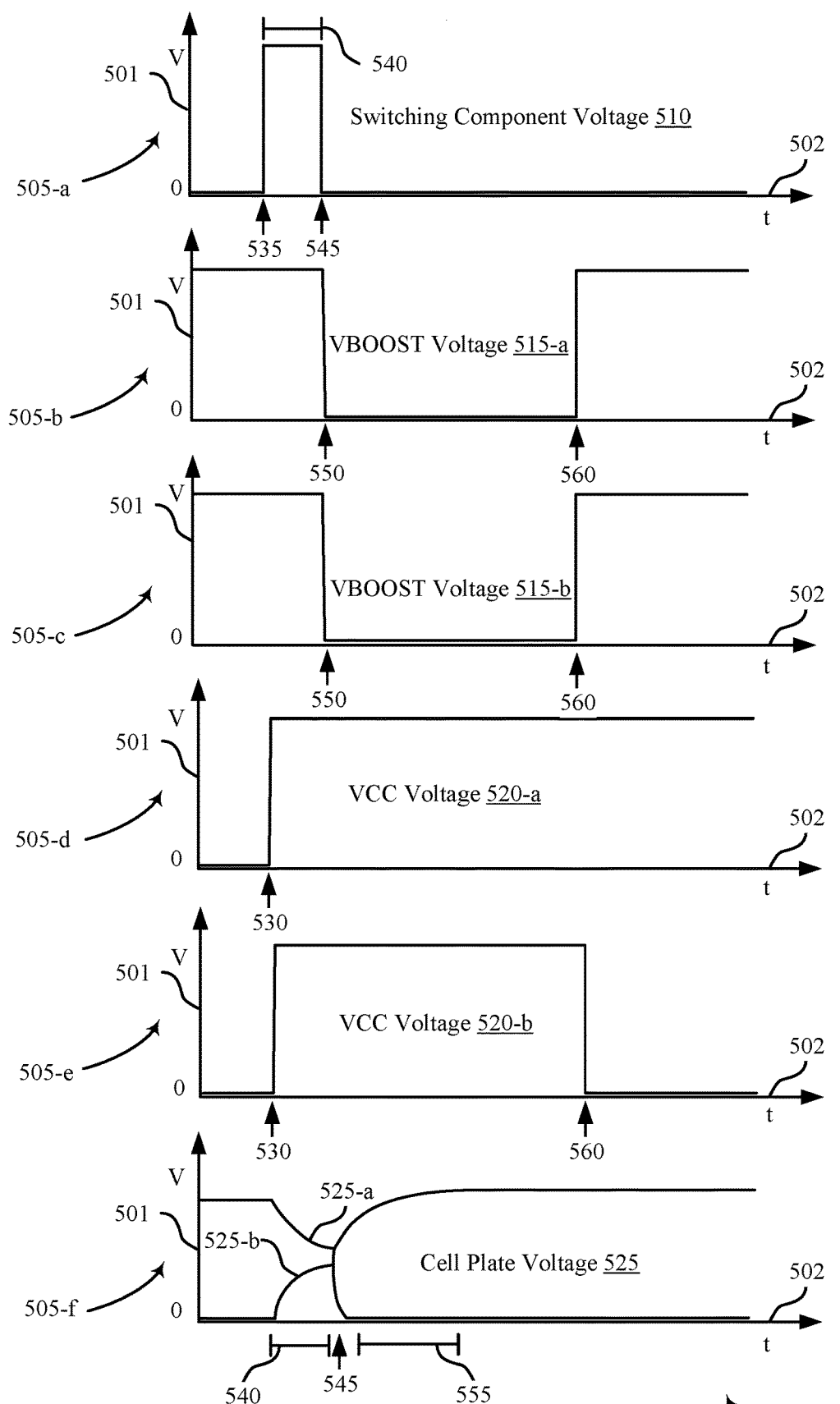
FIG. 5 illustrates an example of a timing diagram system that supports charge sharing between memory cell plates in accordance with various embodiments of the present disclosure.

FIG. 5 illustrates an example of a timing diagram system 500 for operating a ferroelectric memory cell array that charge sharing between memory cell plates in accordance with various embodiments of the present disclosure. Timing diagram system 500 may include timing diagrams 505 (e.g., 505-*a* through 505-*f*), each of which includes voltage on an axis 501 and time on an axis 502. In some embodiments, the timing diagrams 505 may have a common time axis 501 (i.e., the timing diagrams may cover the same time period and could be overlaid) and may represent operations of components of circuit 400 of FIG. 4. The operations may facilitate charge sharing between the cell plates of different sections 405 as described with reference to circuit 400. For example, prior to the operations of timing diagrams 505 the cell plates in section 405-*a* may be fully charged and the cell plates in section 405-*b* may be discharged. The charge of cell plates in section 405-*a* may be used to facilitate the charging of cell plates in section 405-*b*.

Charge sharing resulting from operations depicted in timing diagrams 505 may reduce the power, among other requirements, needed from voltage supplies (VCC 410) and (VBOOST 415) to charge the cell plates in section 405-*b*. In the example depicted in FIG. 5, cell plates in section 405-*a* may be performing a write operation (e.g., writing a logic 1 by reducing the cell plate voltages as described in FIG. 3) and cell plates in section 405-*b* may be performing a read operation (e.g., reading a stored state of the cells by increasing the cell plate voltages). Thus, cells in section 405-*a* (e.g. memory cells 470-*a*) may be selected (e.g., using a first set of word lines 465-*a*) for a write operation and cells in section 405-*b* (e.g., memory cells 470-*b*) may be selected (e.g., using a second set of word lines 465-*b*) for a read operation. However, the techniques described herein may be implemented when cell plates in section 405-*a* are selected to perform other operations, including, but not limited to, those that call for a transition from a charged state to a discharged state.

The voltages of various components of circuit 400 are also represented as a function of time on timing diagrams 505. For example, timing diagram 505-*a* includes switching component voltage 510, which represents the voltage applied to the gate of each switching component 460 in section 405-*a* and section 405-*b*. Voltage applied to switching components 460 in section 405-*a* and section 405-*b* may not be applied to switching components of other sections of circuit 400. By independently controlling the voltage applied to the switching components 460 of each section 405, particular sections 405 may be targeted for, or isolated from, plate charge sharing.

Timing diagram 505-*b* may include VBOOST voltage 515-*a*, which may represent the voltage applied to the gate of switching component 435-*a* (which connects VBOOST 415-*a* to power supply line 420-*a* when activated). Timing diagram 505-*c* may include VBOOST voltage 515-*b*, which may represent the voltage applied to the gate of switching component 435-*b*, which connects VBOOST 415-*b* to power supply line 420-*b* when activated. Timing diagram 505-*d* may include VCC voltage 520-*a*, which may represent the voltage applied to the gate of switching component 430-*a*, which connects VCC 410-*a* to power supply like 420-*a* when activated. Timing diagram 505-*e* may include VCC voltage 520-*b*, which may represent the voltage applied to the gate of switching component 430-*b*, which connects VCC 410-*b* to power supply line 420-*b* when activated. Timing diagram 505-*f* may include cell plate voltages 525. Cell plate voltage 525-*a* may represent the voltage at the cell plates of memory cells 470-*a* in section 405-*a* and cell plate voltage 525-*b* may represent the voltage at the cell plates of memory cells 470-*b* in section 405-*b*.

In some embodiments, prior to the operations of timing diagrams 505, the cell plates of memory cells 470-*a* in section 405-*a* may be connected to VCC 410-*a* (e.g., switching component 430-*a* and switching component 450-*a*-1 may be activated). Also, switching components 460 may be deactivated (e.g., cell plates of memory cells 470-*a* may be isolated from cell plates of 470-*b*). According to timing diagram 505-*d*, at 530 the cell plates of memory cells 470-*a* may be disconnected from VCC 410-*a* by deactivating switching component 430-*a* (e.g., by applying a high VCC voltage 520-*a* to the gate of switching component 430-*a*). Also at 530, VCC voltage 520-*b* (depicted in timing diagram 505-*e*) may be increased, which may deactivate switching component 430-*b*. Switching components 435 may also be deactivated (e.g., so VBOOSTs 415 are disconnected from power supply lines 420). Thus, the voltage supplies VCC 410 and VBOOST 415 may be isolated from power supply lines 420 prior to 535. At 535, according to timing diagram 505-a, the cell plates of memory cells 470-a may be connected to the cell plates of memory cells 470-b by activating switching components 460 (e.g., by applying a high switching component voltage 510 to the gate of each switching component 460, as depicted in timing diagram 505-a). Thus, a conductive path may be established between the cell plates of two different sections 405. The conductive path may facilitate the transfer of charge between the cell plates in section 405-a and section 405-b.

The conductive path may be maintained for a period of time (e.g., duration 540). During this time, the charge on cell plates in section 405-a may be used to charge the cell plates in section 405-b. That is, cell plates in section 405-a may discharge onto the cell plates in section 405-b, as seen in timing diagram 505-f. According to timing diagram 505-f, during duration 540 cell plate voltage 525-a, which corresponds to cell plates of memory cells 470-a, decreases while cell plate voltage 525-b, which corresponds to cell plates of memory cells 470-b, increases. Thus, cell plates in section 405-a may at least partially charge cell plates in section 405-b. This at least partial charging may reduce the power needed (e.g., from voltage supply VCC 410-b, or VBOOST 415-b, or both) to fully charge cell plates in section 405-b to a predetermined threshold voltage.

At the expiration of duration 540, and at 545 of timing diagram 505-a and 505-f, the cell plates in section 405-a may be disconnected (e.g., isolated, cease communication or charge flow) from the cell plates in section 405-b by deactivating the switching components 460 (e.g., the switching component voltage 510 may be reduced to a low value). In some embodiments, duration 540 may be a predetermined period of time (e.g., 5 nanoseconds) that may relate to or correlate with one or more factors, such as charge rate, elapsed time, charge level, some combination, or other factors. Thus, isolation of the cell plates may be based on the determination that a threshold amount of time has elapsed since the establishment of the conductive path. Alternatively, duration 540 may be the time it takes for cell plates in section 405-b to charge to a threshold voltage value. Thus, the isolation of cell plates in section 405-a from cell plates in section 405-b may be based on the voltage of the cell plates in section 405-b (e.g., cell plate voltage 525-b). During duration 540, cell plates in section 405-b may charge without using current from voltage supplies VCC 410-b and VBOOST 415-b, thus conserving power.

After expiry of duration 540 (e.g., after the cell plates of the two sections 405 have been isolated from each other at 545) and before 550, cell plates in section 405-a may be connected to ground 440 (or another voltage reference) by deactivating switching components 450-a and activating switching components 455-a, among other methods. Thus, according to timing diagram 505-f, cell plate voltage 525-a may be reduced to a threshold value (e.g., cell plate voltage 525-a may be reduce to 0V, or nearly 0V, during subsequent duration 555). At 550, cell plates in section 405-b may be connected to VBOOST 415-b through one or more methods, such as by activating switching component 435-b (e.g., by reducing VBOOST voltage 515-b to a threshold value, as depicted in timing diagram 505-c). Thus, according to timing diagram 505-f, cell plates in section 405-b may finish charging to a threshold value (e.g., 1.6 V or 1.8 V) during subsequent duration 555 using charge from VBOOST 415-b. That is, cell plate voltage 525-b may increase to a threshold value (e.g., a read voltage value). Also at 550, VBOOST voltage 515-a may be reduced, which may activate switching component 435-a.

At 560, according to timing diagram 505-e, VCC voltage 520-b may be decreased, which may activate switching component 430-b and connect VCC 410-b to power supply line 420-b. Also at 560, according to timing diagram 505-c, VBOOST voltage 515-b may be increased, which may deactivate switching component 435-b and disconnect VBOOST 415-b from power supply like 420-b. At 560, according to timing diagram 505-b, VBOOST voltage 515-a may be increased, which may deactivate switching component 435-a and disconnect VBOOST 415-a from power supply line 420-a. The operations at 560 may put the circuit 400 in a prepared state for a subsequent access operations (e.g., a read or write operation) or a subsequent charge sharing operation.

Thus, operations of timing diagrams 505 may result in cell plates from section 405-a being fully, or nearly fully, discharged and cell plates from section 405-b being fully, or nearly fully, charged. The power used to charge cell plates from 405-b may be reduced compared to other operational schemes due to charge sharing between plates of different sections 405. The operations of timing diagrams 505 are merely exemplary and can be varied or otherwise modified based on the present disclosure.

Figure 6:
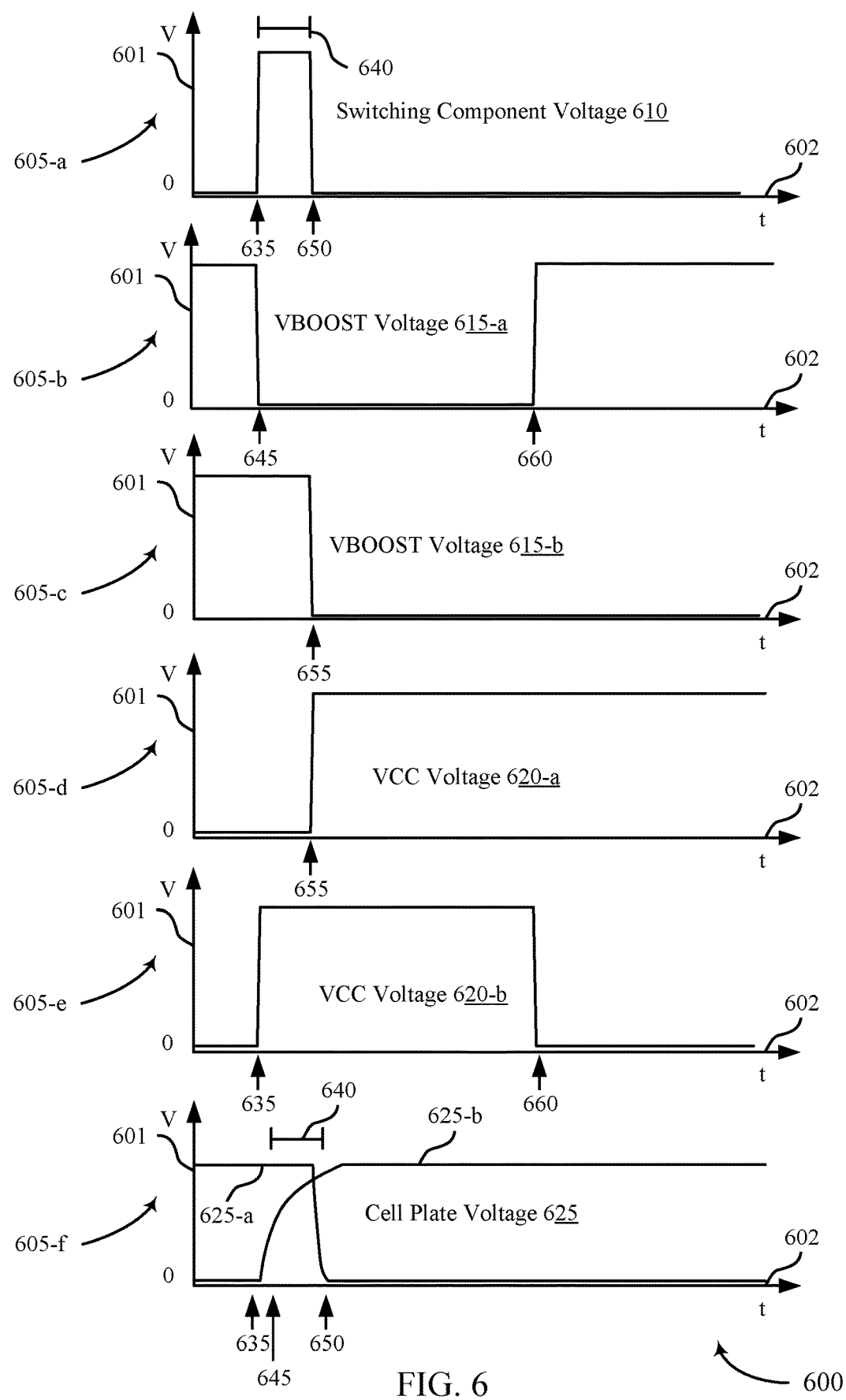
FIG. 6 illustrates an example of a timing diagram system that supports charge sharing between memory cell plates in accordance with various embodiments of the present disclosure.

FIG. 6 illustrates an example of a timing diagram system 600 for operating a ferroelectric memory cell array that charge sharing between memory cell plates in accordance with various embodiments of the present disclosure. Timing diagram system 600 may include timing diagrams 605 (e.g., 605-a through 605-f), each of which includes voltage on an axis 601 and time on an axis 602. In some embodiments, the timing diagrams 605 may have a common time axis 602 (i.e., the timing diagrams cover the same time period and could be overlaid) and may represent operations of components of circuit 400 of FIG. 4. The operations may facilitate charge sharing between the cell plates of different sections 405 as described with reference to circuit 400, among others. For example, prior to the operations of timing diagrams 605 the cell plates of section 405-a may be fully charged and the cell plates of section 405-b may be discharged. The charge of cell plates in section 405-a may be used to facilitate the charging of cell plates in section 405-b.

Charge sharing resulting from operations depicted in timing diagrams 605 may reduce the time needed to charge the cell plates in section 405-b. In the example depicted in FIG. 6, cell plates of memory cells 470-a in section 405-a may be performing a write operation and cell plates of memory cells 470-b in section 405-b may be performing a read operation, among other operations. Thus, cells in section 405-a may be selected (e.g., using a first word line) for a write operation and cells in section 405-b may be selected (e.g., using a second word line) for a read operation.

The voltages of various components of circuit 400 are also represented as a function of time on timing diagrams 605. For example, timing diagram 605-a includes switching component voltage 610, which may represent the voltage applied to the gate of each switching component 460 in section 405-a and section 405-b. Voltage applied to switching components 460 in section 405-a and section 405-b may not be applied to switching components of other sections of circuit 400. By independently controlling the voltage applied to the switching components 460 of each section 405, particular sections 405 may be targeted for, or isolated from, plate charge sharing.

Timing diagram 605-*b* may include VBOOST voltage 615-*a*, which may represent the voltage applied to the gate of switching component 435-*a*, which connects VBOOST 415-*a* to power supply line 420-*a*. Timing diagram 605-*c* may include VBOOST voltage 615-*b*, which may represent the voltage applied to the gate of switching component 435-*b*, which connects VBOOST 415-*b* to power supply line 420-*b* when activated. Timing diagram 605-*d* may include VCC voltage 620-*a*, which may represent the voltage applied to the gate of switching component 430-*a*, which connects VCC 410-*a* to power supply line 420-*a* when activated. Timing diagram 605-*e* may include VCC voltage 620-*b*, which may represent the voltage applied to the gate of switching component 430-*b*, which connects VCC 410-*b* to power supply line 420-*b* when activated. Timing diagram 605-*f* may include cell plate voltages 625. Cell plate voltage 625-*a* may represent the voltage at the cell plates of memory cells 470-*a* in section 405-*a* and cell plate voltage 625-*b* may represent the voltage at the cell plates of memory cells 470-*b* in section 405-*b*.

In some embodiments, prior to 635, VBOOST 415-*a* may be disconnected from power supply line 420-*a* (e.g., VBOOST voltage 615-*a* may be high so that switching component 435-*a* is deactivated, as depicted in timing diagram 605-*b*) and VBOOST 415-*b* may be disconnected from power supply line 420-*b* (e.g., VBOOST voltage 615-*b* may be high so that switching component 435-*b* is deactivated, as depicted in timing diagram 605-*c*). Also prior to 635, VCC 410-*a* may be connected to power supply line 420-*a* (e.g., VCC voltage 620-*a* may be low so that switching component 430-*a* is activated, as depicted in timing diagram 605-*d*) and VCC 410-*b* may be connected from power supply line 420-*b* (e.g., VCC voltage 620-*b* may be low so that switching component 430-*b* is activated, as depicted in timing diagram 605-*e*). Thus, the power supply lines 420 may be disconnected from their respective VBOOSTs 415 and connected to their respective VCCs 410.

At 635, according to timing diagram 605-*a*, cell plates in section 405-*a* may be connected to cell plates of memory cells in section 405-*a* by activating switching components 460 (e.g., by applying an increased switching component voltage 610 to the gates of the switching components 460.) In some embodiments, activation of switching components 460 may establish a conductive path between the cell plates in section 405-*a* and the cell plates in section 405-*b*. The conductive path may facilitate the transfer of charge between the cell plates of memory cells 470-*a* in section 405-*a* and the cell plates of memory cells 470-*b* in section 405-*b*, among other cell plates or components. The cell plates of the two sections 405 may charge share while the conductive path is available; for example, charge sharing may occur while switching components 460 are activated during duration 640. The length of duration 640 may be a predetermined period of time, or based on the voltage of cell plates in section 405-*b* (e.g., cell plate voltage 625-*b*). Also, at 635, cell plates in section 405-*b* may be disconnected from VCC 410-*b* (e.g., by increasing the VCC voltage 620-*b* applied to the gate of switching component 430-*b*). Although not shown, at 435 cell plates in section 405-*b* may be connected to power supply line 420-*b* by activating switching component 450-*b*-1.

At 645, cell plates in section 405-*b* may be connected to VBOOST 415-*b* by activating switching component 435-*b* (e.g., by reducing the VBOOST voltage 615-*a* applied to the gate of switching component 435-*b*, as depicted in timing diagram 605-*b*). Thus, cell plates in section 405-*b* may be charged from two sources—cell plates in section 405-*a* and VBOOST 415-*b*—simultaneously. This charging scheme may reduce the amount of time is takes cell plates in section 405-*b* to charge to a threshold value (e.g., a read voltage value). At 650, cell plates in section 405-*a* may be isolated from cell plates in section 405-*b* by deactivating the switching components 460 (e.g., by reducing the switching component voltage 610 applied to the gates of the switching components 460, as depicted in timing diagram 605-*a*). Thus, after 650 cell plates of memory cells 470-*b* in section 405-*b* may continue to charge using VBOOST 415-*b*.

At 655, the cell plates in section 405-*a* may be disconnected from VCC 410-*a* (e.g., by increasing the VCC voltage 620-*a* applied to the gate of switching component 430-*a*, as depicted in timing diagram 605-*d*) and connected to VBOOST 415-*a* (e.g., by reducing the VBOOST voltage 615-*b* applied to the gate of switching component 435-*a*, as depicted in timing diagram 605-*c*). After cell plates in section 405-*b* have charged to a threshold value (e.g., a read value), and at 660, cell plates in section 405-*b* may be disconnected from VBOOST 415-*a* (e.g., by increasing the VBOOST voltage 615-*a* applied to the gate of switching component 430-*a*, as depicted in timing diagram 605-*b*) and connected to VCC 410-*b* (e.g., by reducing the VCC voltage 620-*b* applied to the gate of switching component 430-*b*, as depicted in timing diagram 605-*e*). In some embodiments, after the cell plates in the two different section 405 have been isolated from each other (e.g., after 650), cell plates in section 405-*a* may be disconnected from power supply line 420-*a* and connected to ground 440 (or other voltage reference) (e.g., by applying a high voltage to switching components 455-*a* and switching components 450-*a*). The operations at 660 may put the circuit 400 in a prepared state for one or more subsequent access operations (e.g., a read or a write operation) or a subsequent charge sharing operation.

As describe herein, charge sharing between plates may reduce the power or time needed to charge a cell plate for an operation (e.g., a read operation, a write operation, another operation). For example, the method described with reference to FIG. 5 may be used to reduce the power drawn from power supply lines 420 when charging a cell plate. The method and techniques described with reference to FIG. 6 may be used to reduce the time needed to charge a cell plate. A device that includes circuit 400 may select which method to use at a first time (e.g., on power-up). For example, the method may be a pre-determined configuration of the device. In some cases, the device may dynamically change methods. For instance, the device may switch from one method to the other without turning off. The switch may occur based on a trigger (e.g., a user input, a detected or a determined value or condition) and/or periodically (e.g., based on an elapsed time, based on the performance or occurrence of one or more operations). In some cases, the device may dynamically select a method to use based on power supply (e.g., battery) parameters or operating characteristics. For instance, the device may select the power-saving method of FIG. 5 when the battery of the device is low (e.g., below a designated battery percentage or rating), or when the battery is not charging. The device may select the time-saving method of FIG. 6 when the battery life is high (e.g., above a designated battery percentage or rating), or when the battery is charging. Additionally or alternatively, the device may dynamically select a method to use based on the speed requirements of the device. For instance, the device may select the time-saving method of FIG. 6 when the device is interested in quick data retrieval. A device may be interested in quick data retrieval when certain application or operations are being run, or when indicated by a user (e.g., via a user input).

Figure 7:
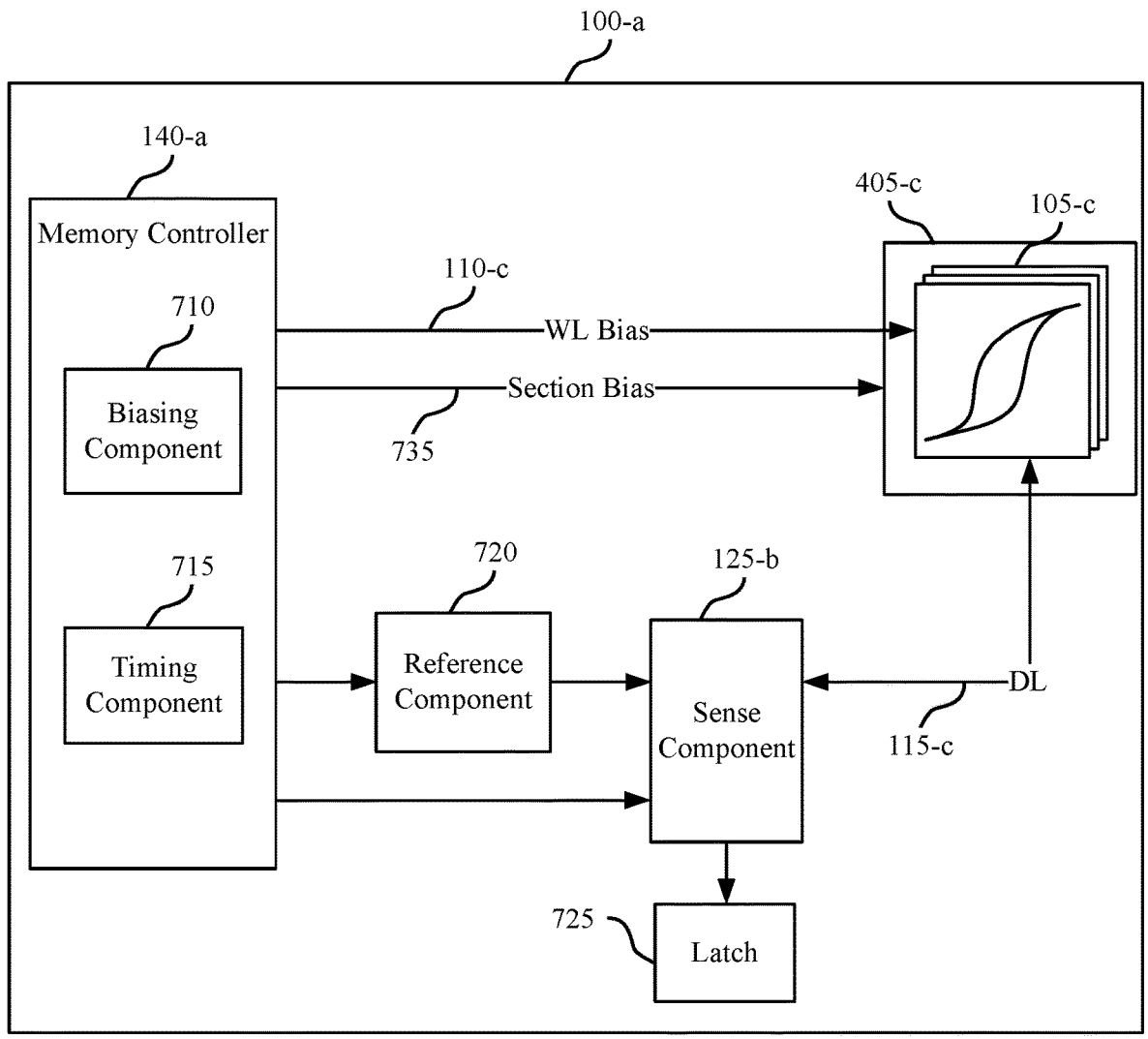
FIG. 7 illustrates a block diagram of an example ferroelectric memory array that supports charge sharing between memory cell plates in accordance with various embodiments of the present disclosure.

FIG. 7 shows a block diagram 700 of a memory array 100-a that supports charge sharing between memory cell plates in accordance with various embodiments of the present disclosure. Memory array 100-a may contain memory controller 140-a, which may be an example of memory controller 140, and sections 405-c, which may be examples of sections 405 described with reference to FIG. 4. Sections 405-c may include memory cells 105-c, which may be examples of memory cells 105 and 470 described with reference to FIGS. 1-4.

Memory controller 140-a may include biasing component 710 and timing component 715 and may operate memory array 100-a as described in FIGS. 1-6. Memory controller 140-a may be in electronic communication with word lines 110-c, digit lines 115-c, sense component 125-b, and sections 405-c, which may be examples of a word line 110 or 465, digit line 115, and sense component 125 described with reference to FIGS. 1-4, among others. Memory array 100-a may also include reference component 720 and latch 725. The components of memory array 100-a may be in electronic communication with each other and may perform the functions described with reference to FIGS. 1-6. In some cases, reference component 720, sense component 125-b and latch 725 may be components of memory controller 140-a.

Memory controller 140-a may be configured to activate various components of memory array 100-a by applying voltages (e.g., positive or negative voltages) to those various components. For example, biasing component 710 may be configured to apply a voltage to operate sections 405-c to read or write memory cells 105-c as described above. In some cases, memory controller 140-a may include a row decoder, column decoder, or both, as described with reference to FIG. 1. This may enable memory controller 140-a to access one or more memory cells 105. Biasing component 710 may also supply voltage to reference component 720 in order to generate a reference signal for sense component 125-b. Additionally, biasing component 710 may supply voltage for the operation of sense component 125-b.

In some cases, memory controller 140-a may perform its operations using timing component 715. For example, timing component 715 may control the timing of voltage application to various components of memory array 100-a to perform the memory functions, such as reading and writing, discussed herein. In some cases, timing component 715 may control the operations of biasing component 710.

In some cases, memory controller 140-a may facilitate (e.g., via biasing component 710 and timing component 715) charge sharing between cell plates of memory cells 105-c in sections 405-c. Memory controller 140-a may, via communication between or relating to biasing component 710 and timing component 715, control the biasing of various components in memory array 100-a, including components of sections 405-c. For example, memory controller 140-a may control the application of voltage to switching components (e.g., via section bias line 735) in sections 405-c to perform the operations described with respect to FIGS. 2A-6.

Memory controller 140-a may facilitate selection of a first ferroelectric memory cell of memory cells 105-c (e.g., a memory cell of memory cells 470-a with respect to FIG. 4) for a first operation (e.g., a read operation or a write operation). In some embodiments, the first ferroelectric memory cell may be selected using a first word line (e.g., word line 465-a with respect to FIG. 4). Memory controller 140-a may also facilitate selection of second ferroelectric memory cell of memory cells 105-c (e.g., a memory cell of memory cells 470-b with respect to FIG. 4) for a second operation (e.g., a read operation or a write operation). In some embodiments, the second ferroelectric memory cell may be selected using a first word line (e.g., word line 465-b with respect to FIG. 4). Thus, in some embodiments, the first ferroelectric memory cell may perform the first operation and the second ferroelectric memory cell may perform the second operation. In some embodiments, the second operation may be performed by the second ferroelectric memory cell based on the timing of the first operation.

Memory controller 140-a may also facilitate establishment of a conductive path between a first plate of the first ferroelectric memory cell and a second plate of a second ferroelectric memory cell, among other components. The conductive path may be established by activating one or more switching components (e.g., switching components 460 with respect to FIG. 4) in electronic communication with the first plate and the second plate. The timing of the establishment may be determined by timing component 715. Charge may transfer from the first plate to the second plate based on the activation of the first switching component. In some cases, the establishment of the conductive path is during a portion of the second operation and based on the selection of the first ferroelectric memory cell and the second ferroelectric memory cell. The timing component 715 may also determine a time to initiate the second operation of the second ferroelectric memory cell. The determination may be based on the timing of the first operation of the first ferroelectric memory cell. The establishment of the conductive path may be based on the time to initiate the second operation.

In some cases, memory controller 140-a may initiate isolation of the first plate from a voltage supply. For example, the first plate may be disconnected from a voltage supply (e.g., VCC 410-a of FIG. 4) by deactivating a switching component (e.g., switching component 430-a of FIG. 4) connecting the voltage supply to a respective power supply line (e.g., power supply line 420-a of FIG. 4). In such cases, the conductive path may be established after the isolation (as determined by the timing component 715). In other cases, the conductive path may be established before or during the isolation (as determined by the timing component 715). In some cases, memory controller 140-a may facilitate isolation of the first plate from the second plate. The isolation may be implemented by deactivating switching components (e.g., switching component 460 of FIG. 4) in electronic communication with the first plate and the second plate. Biasing component 710 may deactivate the switching components by applying an appropriate biasing voltage to the gates of the switching components. Timing component 715 may determine the timing for the isolation based on a determination that a threshold amount of time has elapsed since the establishment of the conductive path. Timing component 715 may determine the timing for the isolation based on a determination that a threshold amount of charge has transferred since the establishment of the conductive path.

After isolation of the cell plates, the timing component 715 may communicate with the biasing component 710 to establish a conductive path between the first plate and a voltage reference (e.g., ground 440 of FIG. 4), which may include establishing a short. The shorting may be based on the isolation of the cell plates. In some cases, the first plate may be shorted to the voltage reference by activating a switching component (e.g., switching component 455-a of FIG. 4) connecting the first plate to the voltage reference. After the first plate has been shorted to the voltage reference, the timing component 715 may communicate with the biasing component 710 to apply a supply voltage (e.g., VBOOST 415-b of FIG. 4) to the second plate. The supply voltage may be applied after the isolation of the plates.

In some cases, the timing component 715 may communicate with the biasing component 710 to apply a supply voltage (e.g., VBOOST 415-b of FIG. 4) to the second plate after the establishment of the conductive path. For example, a conductive path may be established between the second plate and the voltage supply based on the establishment of the conductive path between the first plate and the second plate. The conductive path may be established while charge is transferring from the first plate to the second plate. The supply voltage may be applied by activating a switching component (e.g., switching component 435-b of FIG. 4) that connects the supply voltage to a power line (e.g., power supply line 420-b of FIG. 4) in electronic communication with the second plate. While the supply voltage is applied to the second plate, the timing component 715 may communicate with the biasing component 710 to isolate the first plate from the second plate.

Reference component 720 may include various components to generate a reference signal for sense component 125-b. Reference component 720 may include circuitry specifically configured to produce a reference signal. In some cases, reference component 720 may be other ferroelectric memory cells 105. In some examples, reference component 720 may be configured to output a voltage with a value between the two sense voltages, as described with reference to FIG. 3. Or reference component 720 may be designed to output a virtual ground voltage (i.e., approximately 0V).

Sense component 125-b may compare a signal from memory cell 105-c (through digit line 115-c) with a reference signal from reference component 720. Upon determining the logic state, the sense component may then store the output in latch 725, where it may be used in accordance with the operations of an electronic device using the memory device of which memory array 100-a is a part.

Figure 8:
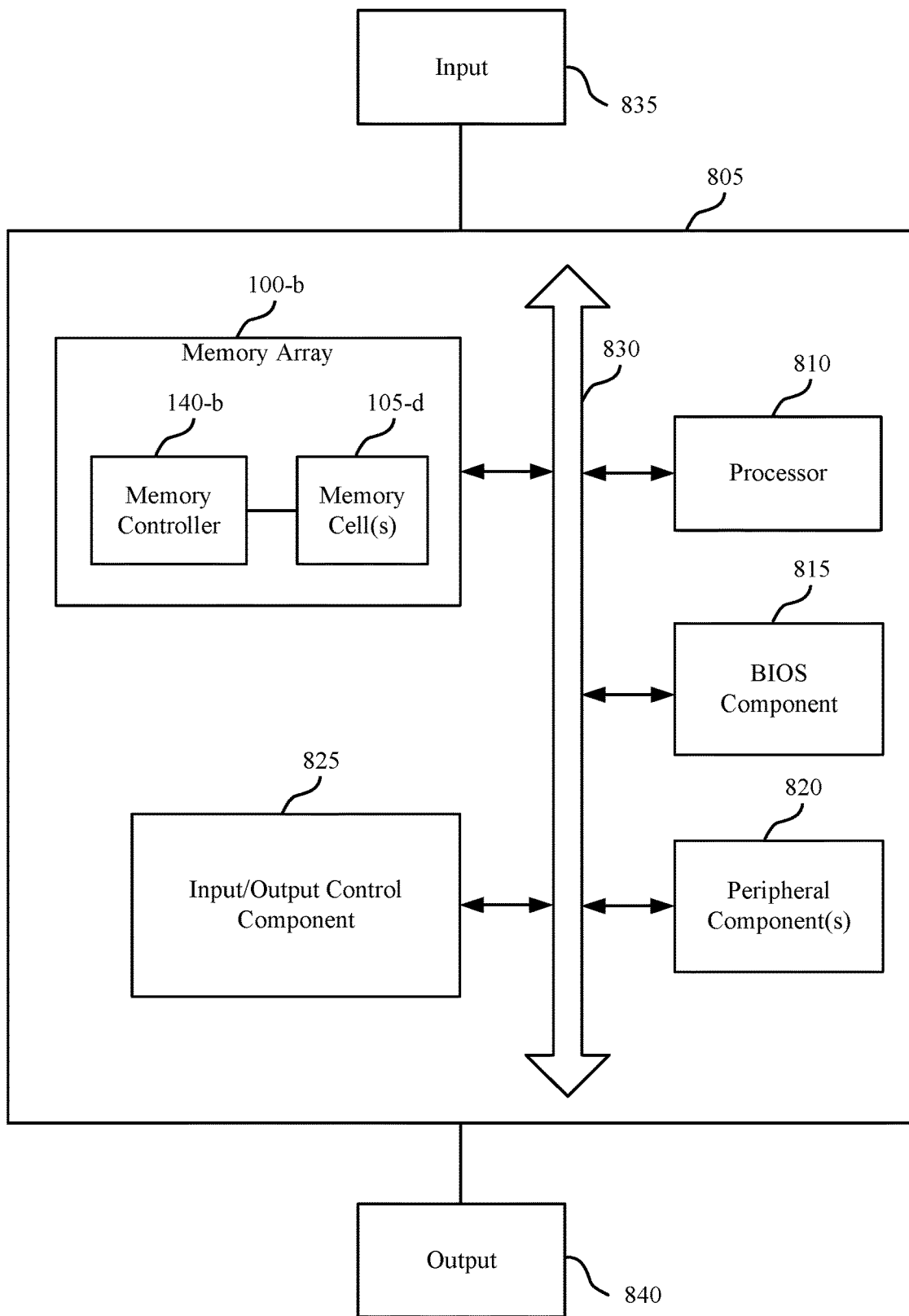
FIG. 8 illustrates a block diagram of a device, including a memory array, that supports charge sharing between memory cell plates in accordance with various embodiments of the present disclosure.

FIG. 8 illustrates a system 800 that supports charge sharing between memory cell plates in accordance with various embodiments of the present disclosure. System 800 includes a device 805, which may be or include a printed circuit board to connect or physically support various components. Device 805 includes a memory array 100-b, which may be an example of memory array 100 described with reference to FIG. 1 and FIG. 7, among others. Memory array 100-b may contain memory controller 140-b and one or more memory cells 105-d, which may be examples of memory controller 140 described with reference to FIGS. 1 and 7 and memory cells 105, or 470, described with reference to FIGS. 1-7, among others. Device 805 may also include a processor 810, BIOS component 815, one or more peripheral components 820, and input/output control component 825. The components of device 805 may be in electronic communication with one another through bus 830.

Processor 810 may be configured to operate memory array 100-b through memory controller 140-b. In some cases, processor 810 may perform the functions of memory controller 140 described with reference to FIGS. 1 and 7. In other cases, memory controller 140-b may be integrated into processor 810. Processor 810 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 810 may perform various functions described herein, including facilitating the transfer of charge between cell plates. Processor 810 may, for example, be configured to execute computer-readable instructions stored in memory array 100-a to cause device 805 perform various functions or tasks.

BIOS component 815 may be a software component that includes a basic input/output system (BIOS) operated as firmware, which may initialize and run various hardware components of system 800. BIOS component 815 may also manage data flow between processor 810 and the various components, e.g., peripheral components 820, input/output control component 825, etc. BIOS component 815 may include a program or software stored in read-only memory (ROM), flash memory, or any other non-volatile memory.

Each of one or more peripheral components 820 may be any input or output device, or an interface for such devices, that is integrated into device 805. Examples may include disk controllers, sound controller, graphics controller, Ethernet controller, modem, USB controller, a serial or parallel port, or peripheral card slots, such as peripheral component interconnect (PCI) or accelerated graphics port (AGP) slots.

Input/output control component 825 may manage data communication between processor 810 and peripheral components 820, input devices 835, or output devices 840. Input/output control component 825 may also manage peripherals not integrated into device 805. In some cases, input/output control component 825 may represent a physical connection or port to the external peripheral.

Input 835 may represent a device or signal external to device 805 that provides input to device 805 or its components. This may include a user interface or interface with or between other devices. In some cases, input 835 may be a peripheral that interfaces with device 805 via peripheral components 820 or may be managed by input/output control component 825.

Output device 840 may represent a device or signal external to device 805 configured to receive output from device 805 or any of its components. Examples of output device 840 may include a display, audio speakers, a printing device, another processor or printed circuit board, etc. In some cases, output device 840 may be a peripheral that interfaces with device 805 via peripheral components 820 or may be managed by input/output control component 825.

The components of memory controller 140-b, device 805, and memory array 100-b may be made up of circuitry designed to carry out their functions. This may include various circuit elements, for example, conductive lines, transistors, capacitors, inductors, resistors, amplifiers, or other active or inactive elements, configured to carry out the functions described herein.

Figure 9:
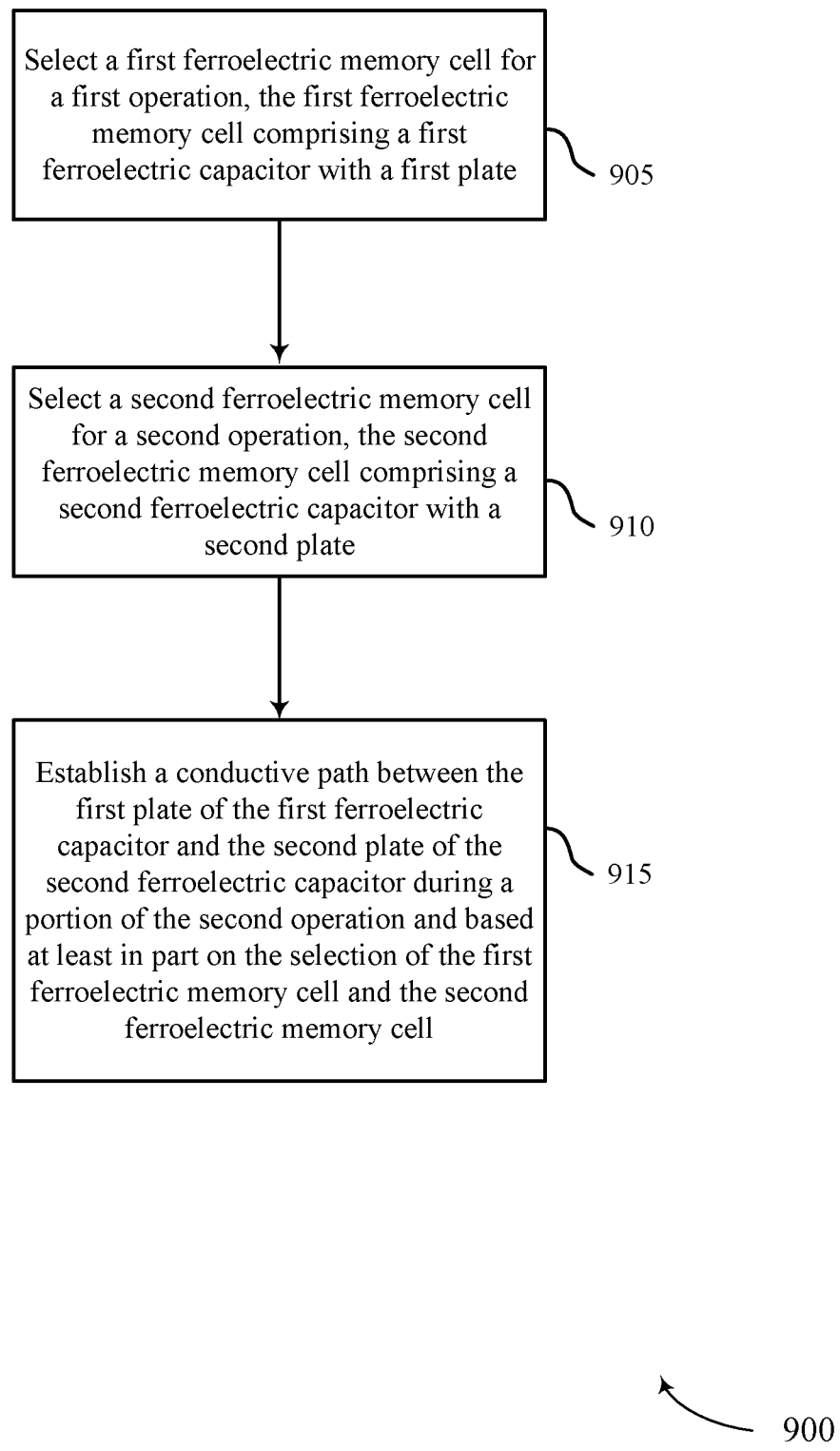
FIGS. 9 and 10 are flowcharts that illustrate a method or methods of operating a memory array that support charge sharing between memory cell plates in accordance with various embodiments of the present disclosure.

FIG. 9 shows a flowchart illustrating a method 900 for charge sharing between memory cell plates in accordance with various embodiments of the present disclosure. The operations of method 900 may be implemented by a memory array 100, as described with reference to FIGS. 1, 7, and 8, among others. For example, the operations of method 900 may be performed by a memory controller 140, as described with reference to FIGS. 1, 7, and 8, among others. In some examples, a memory controller 140 may execute a set of codes to control the functional elements of the memory array 100 to perform the functions described below. Additionally or alternatively, the memory controller 140 may perform aspects the functions described below using special-purpose hardware.

At block 905, the method may include selecting a first ferroelectric memory cell for a first operation (e.g., a read operation or a write operation). The first ferroelectric memory cell may include a first ferroelectric capacitor with a first plate and may be selected using a first word line. In some examples, the operations of block 905 may be performed or facilitated by the biasing component 710 or timing component 715, as described with reference to FIG. 7.

At block 910, the method may include selecting a second ferroelectric memory cell for a second operation (e.g., a read operation or a write operation). The second ferroelectric memory cell may include a second ferroelectric capacitor with a second plate and may be selected using a second word line. In some examples, the method may include determining a time to initiate the second operation of the second ferroelectric memory cell based at least in part on a timing of the first operation of the first ferroelectric memory cell. Thus, the establishment of the conductive path may be based at least in part on the time to initiate the second operation. In some examples, the operations of block 910 may be performed or facilitated by the biasing component 710 or timing component 715, as described with reference to FIG. 7.

At block 915, the method may include establishing a conductive path between the first plate of the first ferroelectric capacitor and the second plate of the second ferroelectric capacitor during a portion of the second operation or based at least in part on the selection of the first ferroelectric memory cell and the second ferroelectric memory cell. In some cases, the method may include isolating the first plate from a voltage supply. Thus, the establishment of the conductive path may be after the isolation. In alternative cases, the establishment of the conductive path may be before or during the isolation. In some examples, the method may include isolating the first plate from the second plate and shorting the first plate to a voltage reference based at least in part on the isolation. In these examples, the method may also include applying a supply voltage to the second plate after the isolation.

In some cases, the method includes applying a supply voltage to the second plate after establishment of the conductive path. In such cases, the first plate may be isolated from the second plate while the supply voltage is applied to the second plate. In some examples, the method includes determining that a threshold amount of time has elapsed since the establishment of the conductive path. Thus, the isolation of the first plate from the second plate may be based at least in part on the determination that the threshold amount of time has elapsed. In other examples, the method includes determining that a threshold amount of charge has transferred since the establishment of the conductive path. Thus, isolation of the first plate from the second plate may be based at least in part on the determination that the threshold amount of charge has transferred. In some examples, the operations of block 915 may be performed or facilitated by the biasing component 710 or timing component 715, as described with reference to FIG. 7.

Figure 10:
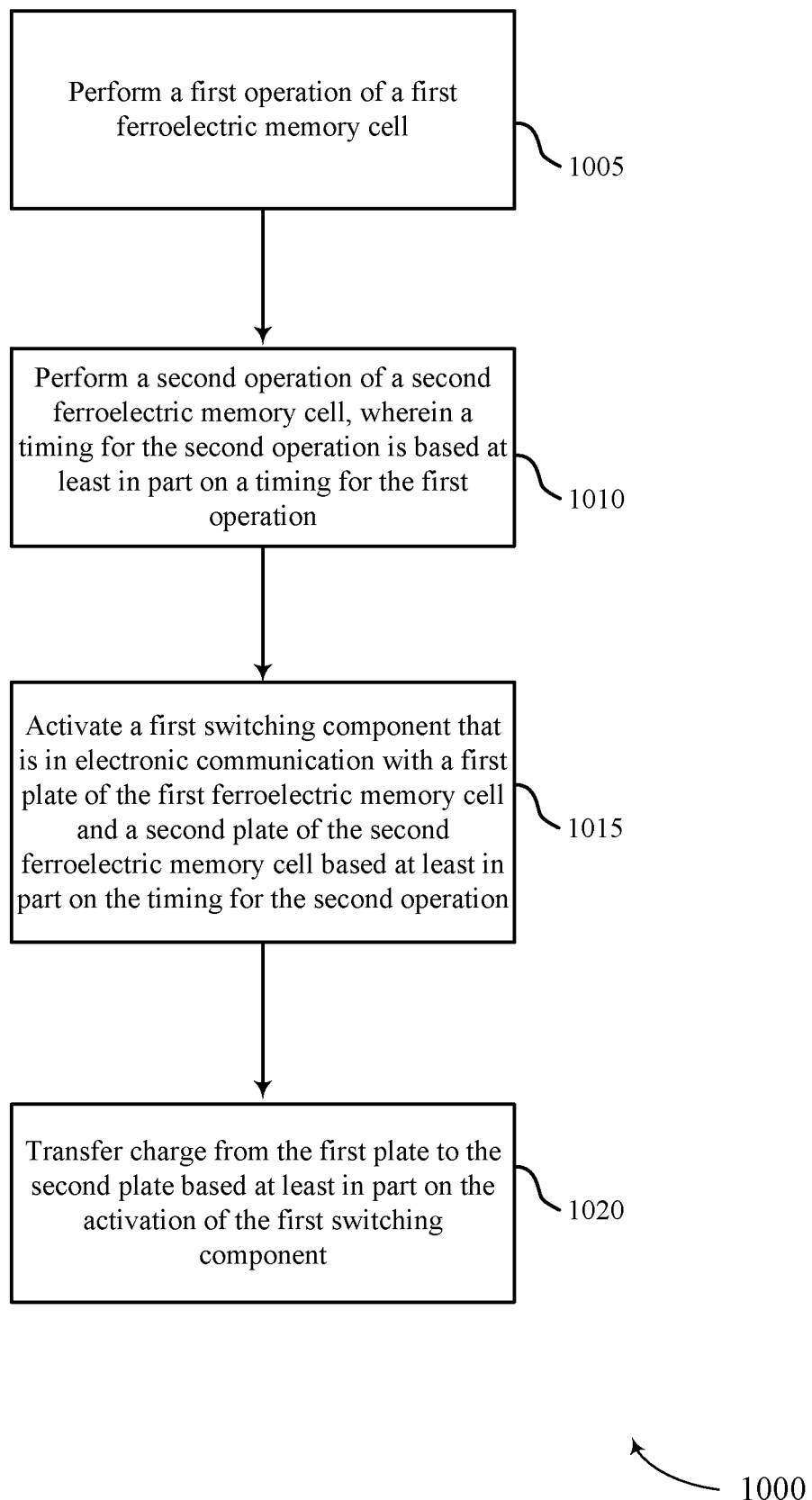

FIG. 10 shows a flowchart illustrating a method 1000 for memory cell sensing with digit line isolation in accordance with various embodiments s of the present disclosure. The operations of method 1000 may be implemented by a memory array 100, as described with reference to FIGS. 1, 7, and 8, among others. For example, the operations of method 1000 may be performed by a memory controller 140, as described with reference to FIGS. 1, 7, and 8. In some examples, a memory controller 140 may execute a set of codes to control the functional elements of the memory array 100 to perform the functions described below. Additionally or alternatively, the memory controller 140 may perform aspects the functions described below using special-purpose hardware.

At block 1005, the method may include performing a first operation of a first ferroelectric memory cell. The first ferroelectric memory cell may be selected using a first word line. In some examples, the operations of block 1005 may be performed or facilitated by the biasing component 710 or timing component 715, as described with reference to FIG. 7.

At block 1010, the method may include performing a second operation of a second ferroelectric memory cell. The timing for the second operation may be based at least in part on the timing for the first operation. The first ferroelectric cell may be selected using a second word line. In some examples, the operations of block 1010 may be performed or facilitated by the biasing component 710 or timing component 715, as described with reference to FIG. 7.

At block 1015, the method may include activating a first switching component that is in electronic communication with a first plate of the first ferroelectric memory cell and a second plate of the second ferroelectric memory cell based at least in part on the timing for the second operation. In some examples, the operations of block 1015 may be performed or facilitated by the biasing component 710 or timing component 715, as described with reference to FIG. 7.

At block 1020, the method may include transferring charge from the first plate to the second plate based at least in part on the activation of the first switching component. In some cases, the method may include activating a second switching component that is in electronic communication with the first plate of a first ferroelectric cell and the second plate of a second ferroelectric cell. Transferring the charge may be based at least in part on the activation of the second switching component. In some examples, the method may include isolating the first plate from the second plate and establishing a conductive path between the first plate and a voltage reference based at least in part on the isolation. The isolation may be based at least in part on the determination that a voltage on the second plate has reached a threshold value (e.g., a value to perform a read operation (a read value) or a value to perform a write operation (a write value)). The method may also include establishing a conductive path between the second plate and a voltage supply based at least in part on the establishment of the conductive path between the first plate and the voltage reference. In some cases, the method includes establishing a conductive path between the second plate and a voltage supply while transferring the charge. In some examples, the operations of block 1020 may be performed or facilitated by the biasing component 710 or timing component 715, as described with reference to FIG. 7.

Thus, methods 900 and 1000 and those described through the present disclosure may provide a method or methods of operating a ferroelectric memory array for charge sharing between memory cell plates. It should be noted that methods 900 and 1000 and those described through the present disclosure describe possible implementations, and the operations and steps may be rearranged or otherwise modified such that other implementations are possible and contemplated. In some examples, aspects from two or more of the methods 900 and 1000 and those described through the present disclosure may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "embodiment," "example," and "exemplary," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The term "isolated" refers to a relationship between components in which electrons are not presently flowing. For example, two components physically connected by a switch may be isolated from each other when the switch is open.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk, and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method, comprising:
coupling a first memory cell with a second memory cell and a power supply for a period of time; and
transferring charge to the first memory cell from the second memory cell and the power supply during a portion of the period of time the first memory cell is coupled with the second memory cell and the power supply.

2. The method of claim 1, further comprising:
isolating the first memory cell from the second memory cell; and
isolating the first memory cell from the power supply after isolating the first memory cell from the second memory cell.

3. The method of claim 2, further comprising:
determining that a threshold amount of time has elapsed since coupling the first memory cell with the second memory cell, wherein isolating the first memory cell from the second memory cell is based at least in part on the determination.

4. The method of claim 2, further comprising:
determining that a voltage of the first memory cell has reached a threshold level, wherein isolating the first memory cell from the second memory cell is based at least in part on the determination.

5. The method of claim 2, further comprising:
coupling the first memory cell with a second power supply after isolating the first memory cell from the power supply.

6. The method of claim 1, further comprising:
coupling the second memory cell with a ground reference after isolating the first memory cell from the second memory cell.

7. The method of claim 1, further comprising:
determining that a plate of the first memory cell has a higher voltage than a plate of the second memory cell, wherein coupling the first memory cell with the second memory cell and the power supply is based at least in part on the determination.

8. The method of claim 1, further comprising:
performing a first access operation at the second memory cell, wherein the first memory cell is coupled with the second memory cell after performing the first access operation at the second memory cell; and
performing a second access operation at the first memory cell, wherein the second access operation is performed after transferring charge to the first memory cell from the second memory cell.

9. A method, comprising:
activating a first switching component to couple a first memory cell with a second memory cell for a period of time; and
activating a second switching component to couple the first memory cell with a power supply during a portion of the period of time the first memory cell is coupled with the second memory cell.

10. The method of claim 9, further comprising:
deactivating the first switching component to isolate the first memory cell from the second memory cell; and
deactivating the second switching component to isolate the first memory cell from the power supply, wherein the second switching component is deactivated after the first switching component.

11. The method of claim 10, further comprising:
activating a third switching component to couple the first memory cell with a second power supply configured to supply a lower voltage than the power supply.

12. The method of claim 9, further comprising:
activating a third switching component to couple the second memory cell with a ground reference after deactivating the second switching component.

13. The method of claim 9, further comprising:
deactivating, before activating the first switching component, a third switching component to isolate the first memory cell from a second power supply configured to supply a lower voltage than the power supply.

14. The method of claim 9, further comprising:
activating a third switching component coupled with the first switching component and the second switching component to couple the first memory cell with the second memory cell for the period of time.

15. A method, comprising:
selecting a first memory cell coupled with a power supply for a first operation;

isolating the first memory cell from the power supply based at least in part on selecting the first memory cell; and transferring charge from a second memory cell to the first memory cell after isolating the first memory cell from the power supply.

16. The method of claim 15, further comprising:

activating, after isolating the first memory cell from the power supply, a plurality of switching components to establish a conductive path between the first memory cell and the second memory cell, wherein transferring the charge from the second memory cell to the first memory cell is based at least in part on establishment of the conductive path.

17. The method of claim 15, further comprising:

isolating the first memory cell from the second memory cell after transferring charge from the second memory cell to the first memory cell; and transferring charge from a second power supply to the first memory cell after isolating the first memory cell from the second memory cell, wherein the second power supply is configured to supply a higher voltage than the power supply.

18. The method of claim 17, further comprising:

isolating the first memory cell from the second power supply after transferring charge from the second power supply to the first memory cell; and coupling the first memory cell with the power supply based at least in part on isolating the first memory cell from the second power supply.

19. The method of claim 15, further comprising:

isolating the second memory cell from a second power supply before transferring charge from the second memory cell to the first memory cell, wherein the power supply and the second power supply are configured to supply voltage at a first level.

20. The method of claim 19, further comprising:

isolating the first memory cell from a third power supply and the second memory cell from a fourth power supply before transferring charge from the second memory cell to the first memory cell, wherein the third power supply and the fourth power supply are configured to supply voltage at a second level higher than the first level.

* * * * *